(12) United States Patent
Hwang et al.

(10) Patent No.: US 10,574,029 B2
(45) Date of Patent: Feb. 25, 2020

(54) PHOTONIC CRYSTAL DEVICE

(71) Applicant: KOREA UNIVERSITY RESEARCH AND BUSINESS FOUNDATION, Seoul (KR)

(72) Inventors: Min-Soo Hwang, Seoul (KR); Hong-Gyu Park, Seoul (KR); Kyoung-Ho Kim, Chungcheongnam-do (KR); Jae-Hyuck Choi, Seoul (KR); Ha-Reem Kim, Seoul (KR); You-Shin No, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/846,546

(22) Filed: Dec. 19, 2017

(65) Prior Publication Data

US 2018/0358779 A1 Dec. 13, 2018

(30) Foreign Application Priority Data

Jun. 9, 2017 (KR) .................. 10-2017-0072751

(51) Int. Cl.
*H01S 5/10* (2006.01)
*H01S 5/042* (2006.01)
*H01S 5/02* (2006.01)
*H01S 5/06* (2006.01)
*H01S 5/343* (2006.01)
*H01S 5/04* (2006.01)

(52) U.S. Cl.
CPC ............ *H01S 5/105* (2013.01); *H01S 5/0206* (2013.01); *H01S 5/0425* (2013.01); *H01S 5/0608* (2013.01); *H01S 5/1021* (2013.01); *H01S 5/041* (2013.01); *H01S 5/3434* (2013.01); *H01S 5/34306* (2013.01)

(58) Field of Classification Search
CPC ...... H01S 5/105; H01S 5/1021; H01S 5/0601; H01S 5/2022; H01S 5/18319
See application file for complete search history.

(56) References Cited

U.S. PATENT DOCUMENTS 6,711,200 B1 * 3/2004 Scherer ................. B82Y 20/00
372/19
7,046,878 B2 5/2006 Noda et al.

FOREIGN PATENT DOCUMENTS

KR 10-2004-0082302 A 9/2004

OTHER PUBLICATIONS

Brunstein el al. ("Radiation patterns from coupled photonic crystal nanocavities"; Applied Physics Letters, 99, 111101, 2011) (Year: 2011).*
Wu et al. ("Slow light performance enhancement using graphene based photonic crystal coupled cavity waveguide"; Asia communications and photonics conference, OSA, 2016) (Year: 2016).*

(Continued)

*Primary Examiner* — Tod T Van Roy
(74) *Attorney, Agent, or Firm* — Jenkins, Wilson, Taylor & Hunt P.A.

(57) ABSTRACT

A photonic crystal device includes a two-dimensional crystal including a gain medium and having a first photonic crystal resonator and a second photonic crystal resonator spaced apart from each other and a graphene layer disposed to cover a portion of the first photonic crystal resonator and not to cover the second photonic crystal resonator.

10 Claims, 24 Drawing Sheets

(56) References Cited

OTHER PUBLICATIONS

Liu et al. ("Tunable coupled-resonator-induced transparency in a photonic crystal system based on a multilayer-insulator graphene stack"; Materials, 11, 2042, 2018) (Year: 2018).*
Mingaleev et al., "Coupled-resonator-induced reflection in photonic-crystal waveguide structures," Optics Express, vol. 16, No. 15, pp. 11647-11659 (Jul. 21, 2008).
Gan et al., "Controlled Light-Matter Interaction in Graphene Electrooptic Devices Using Nanophotonic Cavities and Waveguides," IEEE Journal of Selected Topics in Quantum Electronics, vol. 20, No. 1, 11 pages total (Jan./Feb. 2014).
Korean Office Action for Application No. 10-2017-0072751 dated Jun. 29, 2018.
Korean Office Action for Application No. 10-2017-0072751 dated Dec. 28, 2018.
Husain, "Nanotube and nanowire devices," Thesis, California Institute of Technology (2004).
Kim et al., "Direct observation of exceptional points in coupled photonic-crystal lasers with asymmetric optical gains," Nature Communications, 7:13893, pp. 1-9 (2016).
Wang et al., "Photonic Structure-Integrated Two-Dimensional Material Optoelectronics," Electronics, vol. 5, No. 93, pp. 1-18 (2016).
Korean Grant of Patent for Application No. 10-2017-0072751 dated Jun. 19, 2019.

* cited by examiner

US 10,574,029 B2

PHOTONIC CRYSTAL DEVICE

CROSS-REFERENCE TO RELATED APPLICATIONS

This U.S. non-provisional patent application claims priority under 35 U.S.C. § 119 to Korean Patent Application No. 10-2017-0072751, filed on Jun. 9, 2017, in the Korean Intellectual Property Office, the entire contents of which are incorporated by reference herein.

TECHNICAL FIELD

The present disclosure relates to nano-photonic integrated circuits and, more particularly, to a nano-photonic crystal device smaller than a wavelength.

BACKGROUND

A photonic crystal has a photonic band gap formed by a periodical arrangement of different dielectric constants. The photonic crystal may be applied to lasers, optical switches or the like. Two-dimensional photonic crystal structures may be classified into a triangular lattice structure and a square lattice structure according to lattice structure.

When a resonator is designed in a photonic crystal, a single-cell resonator may be provided by introducing a single crystal. In addition, a linear type resonator may be provided by introducing linearly arranged crystals or a ring type resonator may be provided by introducing ring type crystals. A photonic crystal resonator may generate a laser by introducing a gain medium into a resonator.

SUMMARY

A feature of the present disclosure is to change laser oscillation characteristics using an interaction of two photonic crystal resonators.

Another feature of the present disclosure is to provide a photonic crystal device which is capable of controlling an exceptional point using a pair of nano-sized photonic crystal resonators. If a laser decreases in size, it is easy to observe a singular point and it is much easier to manufacture a novel photonic device using the exceptional point.

A photonic crystal device according to example embodiments includes: a two-dimensional crystal including a gain medium and having a first photonic crystal resonator and a second photonic crystal resonator spaced apart from each other; and a graphene layer disposed to cover a portion of the first photonic crystal resonator and not to cover the second photonic crystal resonator.

In example embodiments, the photonic crystal device may further include a control electrode locally disposed on the graphene layer. The control electrode may electrically control light absorption characteristics of the graphene layer by applying a voltage to the graphene layer.

In example embodiments, the first photonic crystal resonator and the second photonic crystal resonator may oscillate to bonding natural mode/anti-bonding natural mode or single natural mode according to a voltage of the control electrode.

In example embodiments, the graphene layer may cover one-third of the first photonic crystal resonator.

In example embodiments, the photonic crystal may include: a semiconductor substrate; an etch-stop layer grown as a crystal on the semiconductor substrate; a lower sacrificial semiconductor layer grown as a crystal on the etch-stop layer; a first semiconductor layer of first conductivity type grown on the lower sacrificial semiconductor layer; an active semiconductor layer disposed on the first semiconductor layer; and a second semiconductor layer of second conductivity type disposed on the active semiconductor layer. The photonic crystal may include a plurality of holes penetrating the first semiconductor layer, the active semiconductor layer, and the second semiconductor layer. The holes may have the same diameter and may be two-dimensionally and periodically arranged to provide a photonic crystal. Lower surfaces of the holes may communicate with a cavity formed in the lower sacrificial semiconductor layer and filled with air. The first photonic crystal resonator may include a first post formed in the lower sacrificial semiconductor layer, and the second photonic crystal resonator may include a second post formed in the lower sacrificial semiconductor layer. Each of the first and second photonic crystal resonators may be formed such that some of periodically arranged holes are removed or diameters of the holes are made relatively small.

In example embodiments, the semiconductor substrate may be an InP substrate doped with p-type impurities. The etch-stop layer may be an InGaAs layer doped with p-type impurities. The lower sacrificial semiconductor layer may be an InP layer doped with p-type impurities. The first semiconductor layer of the first conductivity type may be an InGaAsP layer doped with p-type impurities. The active semiconductor layer may be a quantum well structure including an undoped InGaAsP layer. The active semiconductor layer may operate as a gain medium. The second semiconductor layer of the second conductivity type may be an InGaAsP layer doped with n-type impurities.

In example embodiments, the photonic crystal device may further include an insulating support filling an edge of the cavity formed by removing the lower sacrificial semiconductor layer.

In example embodiments, the photonic crystal device may further include an external pumping light source providing a pumping light between the first photonic crystal resonator and the second photonic crystal resonator.

In example embodiments, the holes may have a triangular lattice structure. Each of the first and second photonic crystal resonators may have a structure in which three holes arranged adjacent to each other are removed and a pair of small holes are arranged.

In example embodiments, the photonic crystal device may further include: an auxiliary substrate disposed below the semiconductor substrate; an auxiliary substrate electrode disposed on the auxiliary substrate and exposed; and an ion-gel disposed to cover the auxiliary substrate electrode and the control electrode.

In example embodiments, the photonic crystal device may further include: an upper electrode disposed in ohmic contact with the second semiconductor layer and exposed; and a lower electrode disposed below the semiconductor substrate and disposed in ohmic contact with the semiconductor substrate. A light is emitted at the active semiconductor layer by applying current between the upper electrode and the lower electrode.

In example embodiments, the graphene layer may include: a first graphene layer; an interlayer dielectric disposed on the first graphene layer; and a second graphene layer disposed on the graphene layer. The control electrode may include: a first control electrode disposed on the first graphene layer and exposed; and a second control electrode disposed on the second graphene layer and exposed. Light absorption rates of the first graphene layer and the second graphene layer may be adjusted by applying a voltage between the first control electrode and the second control electrode.

In example embodiments, the first photonic crystal resonator and the second photonic crystal resonator may be disposed to be vertically symmetrical with respect to three-line holes.

BRIEF DESCRIPTION OF THE DRAWINGS

The present disclosure will become more apparent in view of the attached, example drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1:
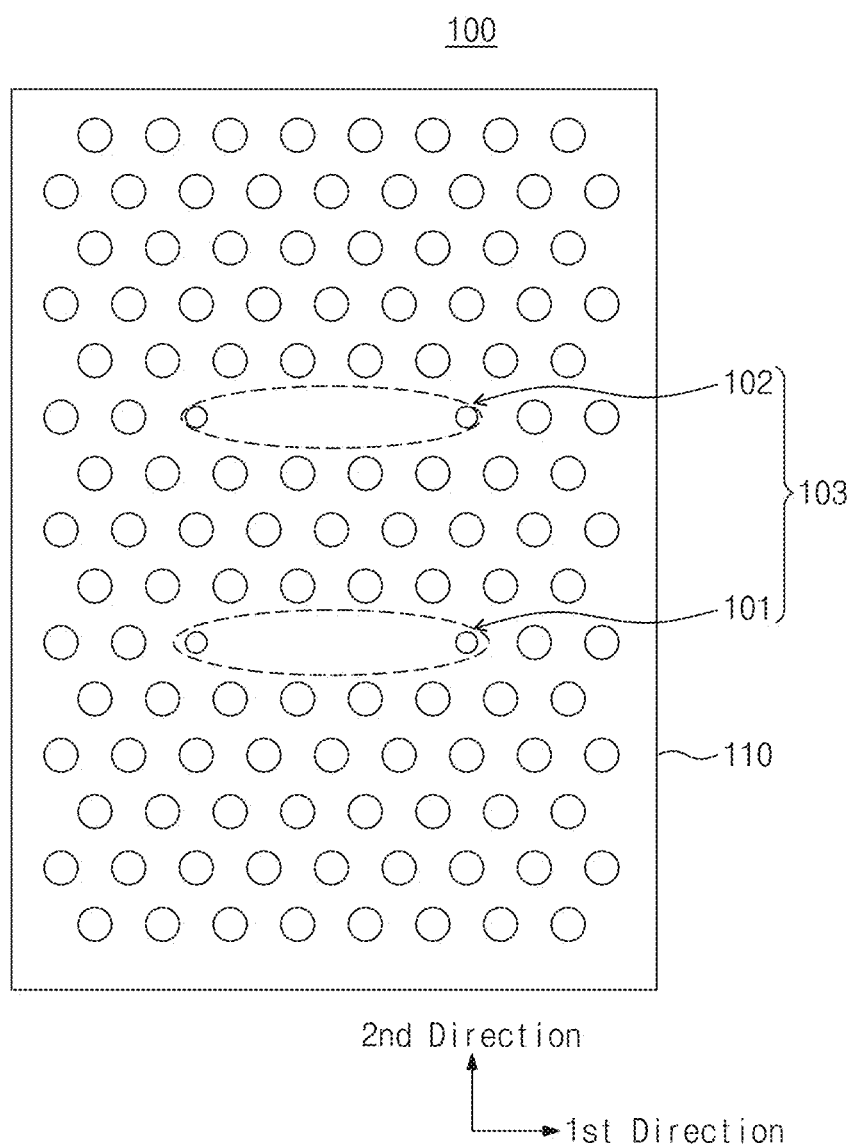
FIG. 1 is a conceptual diagram illustrating generation and loss of a local light of a photonic crystal device according to an example embodiment of the present disclosure.

According to an example embodiment of the present disclosure, if a portion where a light is generated and a portion where the light is lost are spatially separated each other in a photonic crystal device, an interaction occurs therebetween to exhibit new optical characteristics. A point where a new phenomenon occurs is called an exceptional point. Near the exceptional point, a light is allowed to travel only in one direction and colors of a laser are allowed to be one.

Two photonic crystal resonators of the same size using a semiconductor material is manufactured to implement optical gain and loss in a photonic crystal resonator that is as small as a wavelength of a light.

The two photonic crystal resonators are very closely disposed to maximize an interaction between the two photonic crystal resonators. By covering only one of the two photonic crystal resonators (first photonic crystal resonator) with a graphene, optical loss occurs in the first photonic crystal resonator and optical gain occurs in the other photonic crystal resonator (second photonic crystal resonator).

A photonic crystal resonator receives a pumping light from the outside to provide laser characteristics of a natural mode in the photonic crystal resonator. Through the pumping light, optical gain occurs in a portion that is not covered with a graphene but optical loss caused by the graphene continues to occur in a portion that is covered with the graphene. To confirm whether local optical gain/loss distributions caused by the graphene are implemented, laser characteristics before/after applying the graphene are observed through spectrum and mode image analysis. Before applying the graphene, the photonic crystal resonator exhibits two natural mode laser characteristics of bonding/anti-bonding. After applying the graphene, the photonic crystal resonator exhibits a single natural mode laser characteristic.

Laser characteristics of the natural mode were observed while moving an optical pumping position. In the case of the photonic crystal resonator which is partially covered with a graphene, laser characteristics vary depending on an area obtained by covering the first photonic crystal resonator with the graphene. In the case of the first photonic crystal resonator whose two-third is covered with the graphene, a single natural mode laser characteristic is always exhibited.

In the case that one-third of a photonic crystal resonator is covered with the graphene, both bonding/anti-bonding natural mode and single natural mode laser characteristics were exhibited depending on an optical pumping position. Particularly, in the case that one-third of the first photonic crystal resonator is covered with the graphene, an exceptional point where a state changed from the bonding/anti-bonding natural mode to the single natural mode could be directly observed. This means that local optical loss in a photonic crystal resonator may be controlled by controlling an area of the graphene covering the photonic crystal resonator.

Optical absorption characteristics of a graphene may be controlled by externally applying a voltage to the graphene. According to an example embodiment of the present disclosure, optical absorption characteristics of a graphene are changed using a method for applying a voltage through ion-gel. An exceptional point of a natural mode in a photonic crystal resonator may be adjusted by electrically controlling the optical absorption characteristics of the graphene.

In order for a nano-photonic device to play a practically important role, electric driving and efficient optical signal extraction are important. An electric driving photonic device may be used as an ultimate light source of a minimum-sized photonic integrated circuit and requires a platform which is capable of efficiently inducing a light oscillated from a light source in a desired direction to efficiently extract an optical signal.

A photonic crystal structure according to an example embodiment of the present disclosure may be driven not only by optical pumping, but also by self-illumination pumping performed by current injection. Moreover, it is very easy to connect an optical waveguide to another resonator in a photonic crystal.

A photonic crystal device according to an example embodiment of the present disclosure may provide an optically switchable electric driving photonic device by adding an electric driving method and an optical waveguide.

A self-illuminating photonic crystal laser generated by current injection may use an InGaAsP semiconductor of n-i-p diode structure. An intrinsic semiconductor layer may include a quantum well layer. A p-type semiconductor may include an InGaAsP layer doped with p-type impurities. An n-type semiconductor may be disposed on an upper surface of a photonic crystal and may include an InGaAsP layer doped with n-type impurities. Current flows from a base to a surface of the n-type semiconductor layer along a photonic crystal pillar. A metal electrode disposed in an outer circumferential portion of the photonic crystal may be in ohmic contact with the n-type semiconductor. The current flows along the photonic crystal pillar and recombines at the quantum well layer of the resonator to emit a light.

The quantum well layer may react to an external stimulus such as external pumping light or current injection to oscillate in a wavelength area of 1100 nm to 1700 nm. Optical modulation such as wavelength variation, optical switching or wavelength switching within a corresponding wavelength area may be performed according to a structure of a photonic crystal resonator.

A graphene covers one of two photonic crystal resonators according to an example embodiment of the present disclosure. The graphene may be connected to an electrode, and the electrode may change an oscillation wavelength produced by applying a voltage. In particular, an insulating layer such as boron nitride may be inserted between the photonic crystal and the graphene to electrically insulate the graphene from the photonic crystal. The graphene may be applied with a gate voltage by the insulating layer. Since the graphene is very thin, optical gain/loss control effects of a graphene-photonic crystal resonator may be obtained at the same time. Thus, an exceptional point of a resonator may be controlled by controlling a light absorption rate.

According to an example embodiment of the present disclosure, a photonic crystal optical wavelength may be connected to a side of an optical resonator which is not covered with the graphene. A frequency modulation laser electrically driven by connection of the optical waveguide may be efficiently induced in a desired direction.

Since a photonic crystal device according to an example embodiment of the present disclosure is simple in manufacturing process and may control local optical gain and loss distributions, an unnecessary mechanical device is not required. In addition, the photonic crystal device may provide stable manufacturing and driving of a nanolaser which is capable of controlling an exceptional point. Near the exceptional point, a light is allowed to travel in only one direction and colors of a laser are allowed to be one.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of the present disclosure to those of ordinary skill in the art. In the drawings, the thicknesses of layers and regions are exaggerated for clarity. Like reference characters and/or numerals in the drawings denote like elements, and thus their description may be omitted.

FIG. 1 is a conceptual diagram illustrating generation and loss of a local light of a photonic crystal device according to an example embodiment of the present disclosure.

Figure 2:
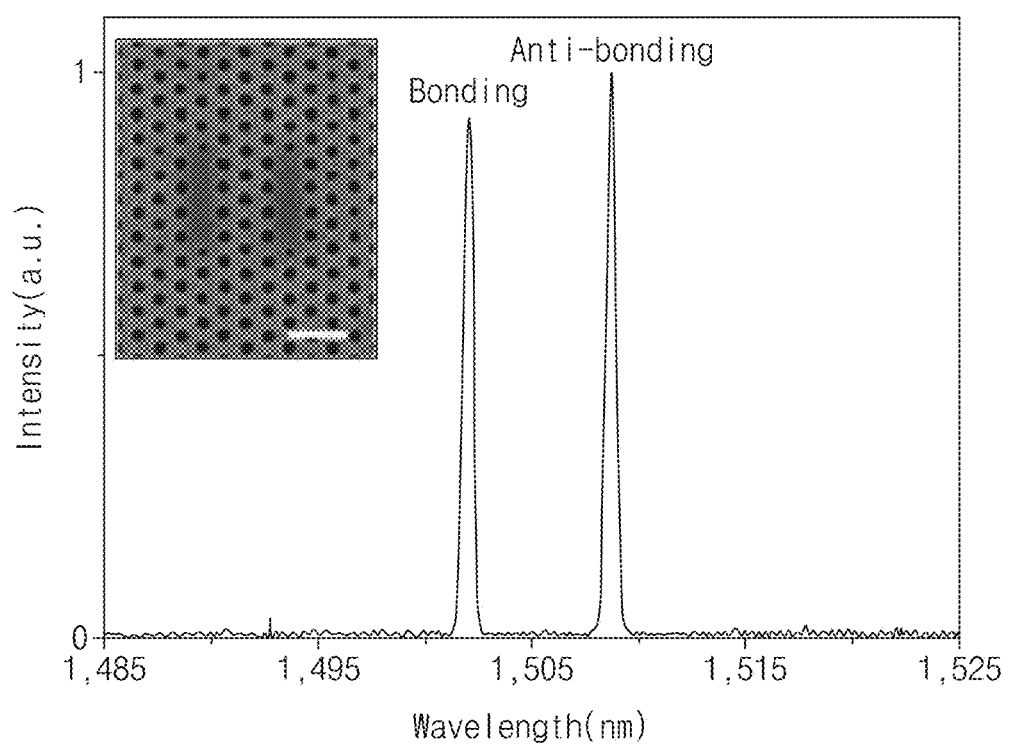
FIG. 2 illustrates an oscillation wavelength of the photonic crystal device in FIG. 1.

FIG. 2 illustrates an oscillation wavelength of the photonic crystal device in FIG. 1.

Figure 3:
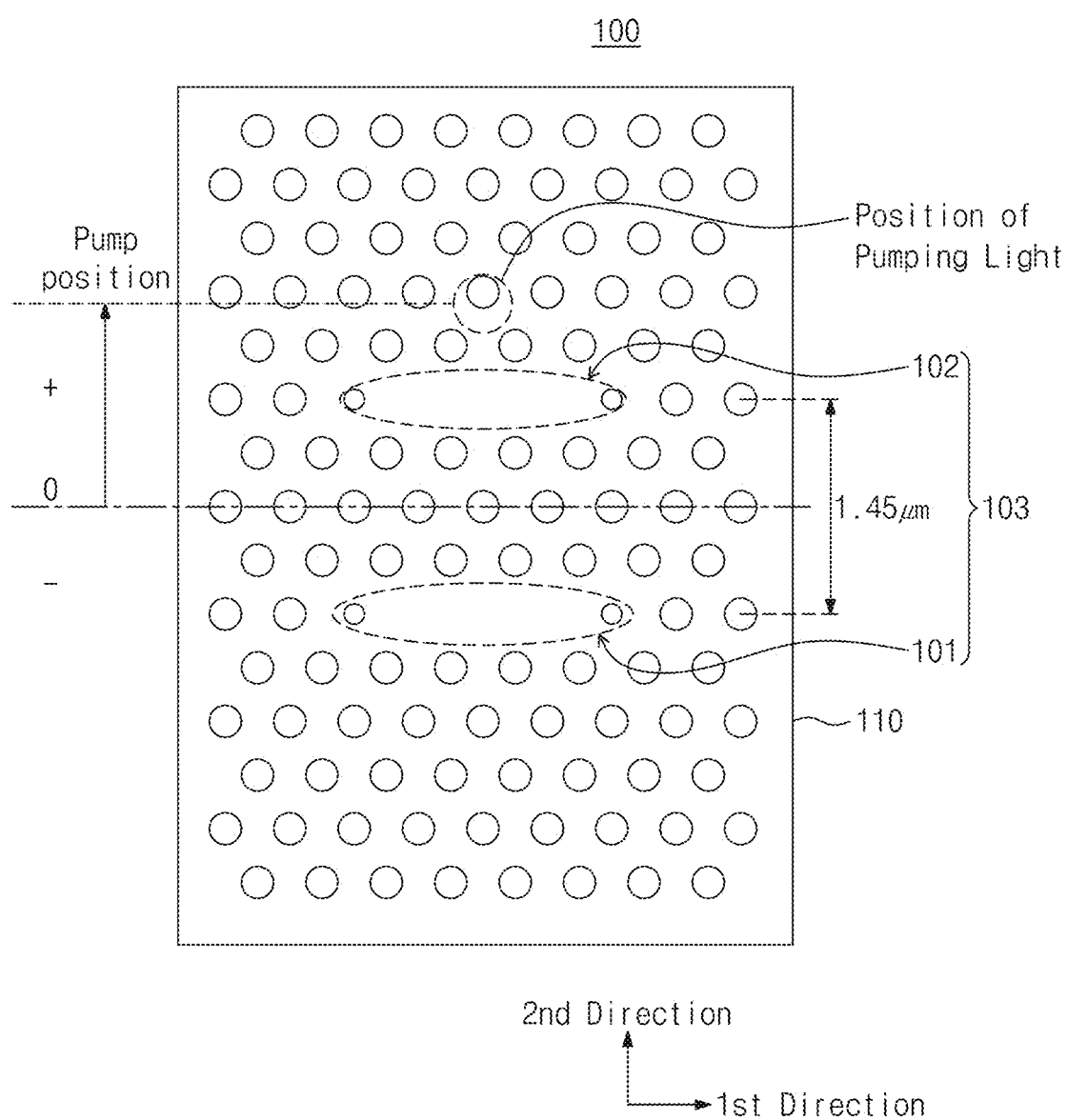
FIG. 3 is a top plan view illustrating a pumping position of a photonic crystal device according an example embodiment of the present disclosure.

FIG. 3 is a top plan view illustrating a pumping position of a photonic crystal device according an example embodiment of the present disclosure.

Figure 4:
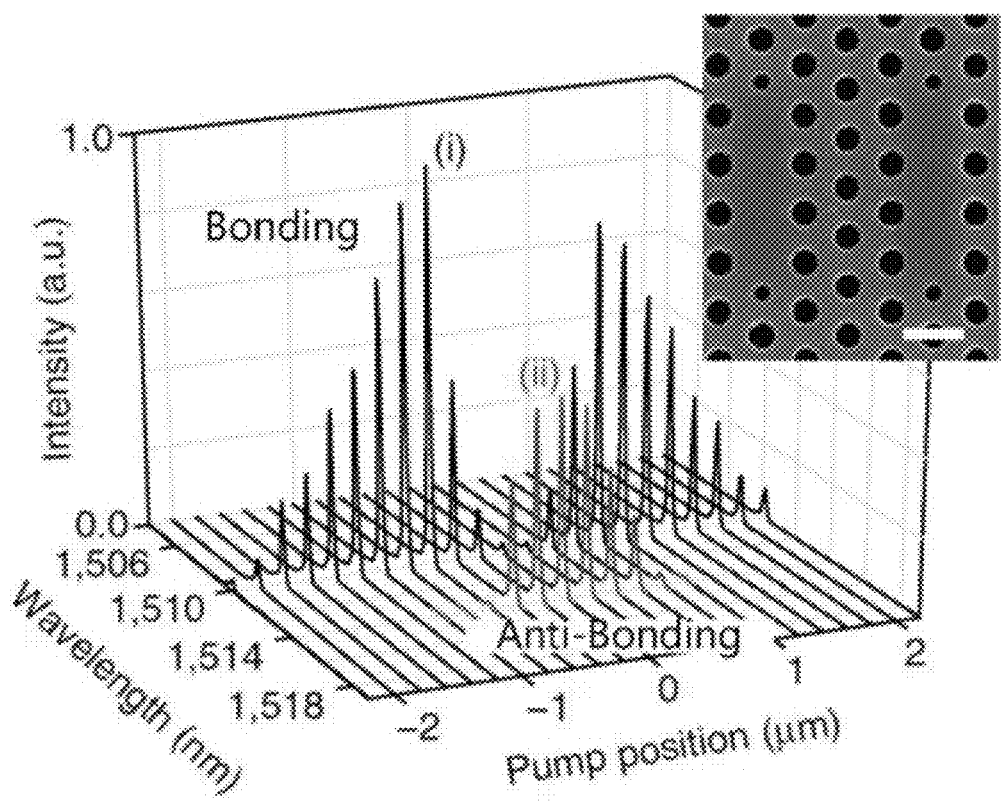
FIG. 4 illustrates oscillation wavelength and intensity of the photonic crystal device depending on the pumping position in FIG. 3.

FIG. 4 illustrates oscillation wavelength and intensity of the photonic crystal device depending on the pumping position in FIG. 3.

Referring to FIGS. 1 and 2, a photonic crystal device 100 includes a first photonic crystal resonator 101 and a second photonic crystal resonator 102 which are coupled to each other. The first photonic crystal resonator 101 and the second photonic crystal resonator 102 have the same structure. Each of the first and second photonic crystal resonators 101 and 102 has a structure in which three holes arranged in a first direction are removed and a pair of holes formed at opposite sides decrease in diameter. The first photonic resonator 101 and the second photonic resonator 102 may be spaced apart from each other by 1.45 micrometer in a second direction. Three holes arranged in the first direction may be formed between the first photonic crystal resonator 101 and the second photonic crystal resonator 102.

The first photonic resonator 101 and the second photonic resonator 102 may oscillate in a bonding mode and an anti-bonding mode according to optical gain and optical loss of each of the first photonic resonator 101 and the second photonic resonator 102. A gain medium may include a III-V based semiconductor layer and may have a p-i-n structure. The first photonic crystal resonator 101 and the second photonic resonator 102 may be disposed to be vertically symmetrical with respect to three-line holes.

While a pumping light of 980 nanometers is externally irradiated to the photonic crystal device 100, a bonding lasing peak and an anti-bonding lasing peak of the first and second photonic crystal resonators 101 and 102 coupled without a graphene layer are observed at 1502.1 nanometer and 1508.8 nanometers, respectively.

Referring to FIGS. 3 and 4, a bonding mode of 1510.1 nanometers oscillates when a pumping position is −2.2 micrometer to +2.2 micrometers, and an anti-bonding mode oscillates when a pumping position is −0.6 micrometer to +0.6 micrometer.

Figure 5:
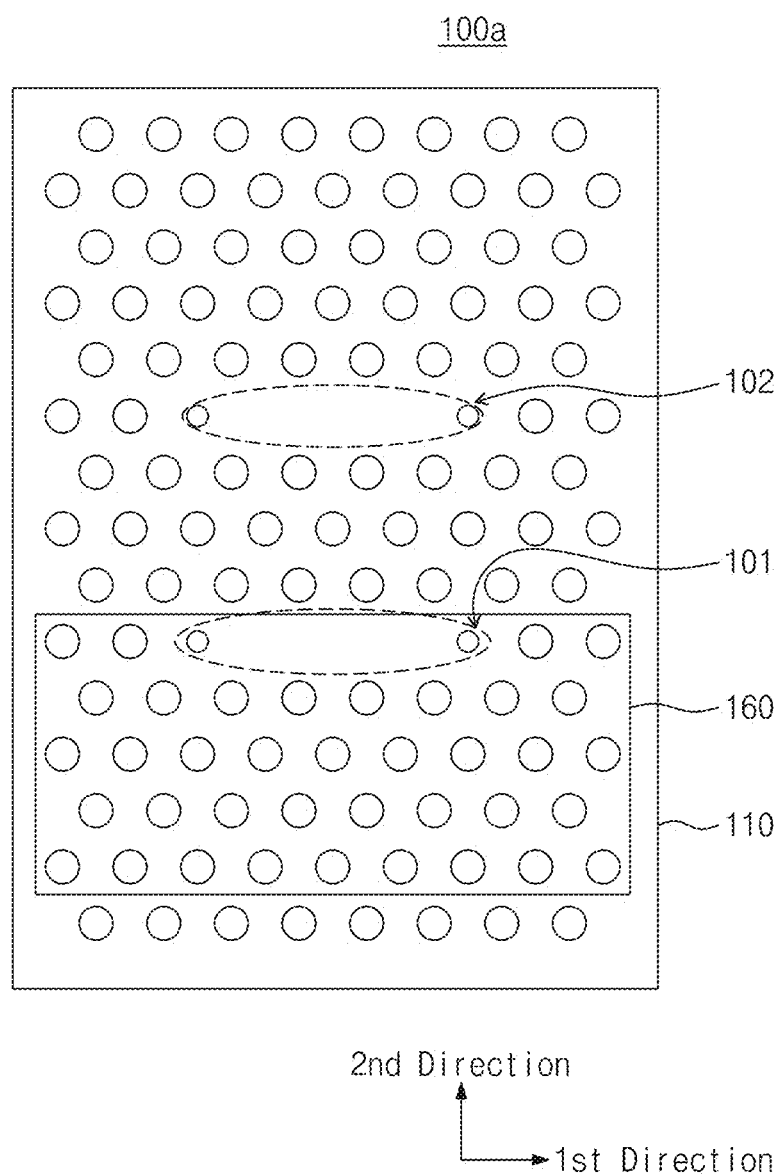
FIG. 5 is a conceptual diagram illustrating generation and loss of a local light of a photonic crystal device using a graphene according to an example embodiment of the present disclosure.

FIG. 5 is a conceptual diagram illustrating generation and loss of a local light of a photonic crystal device using a graphene according to an example embodiment of the present disclosure.

Figure 6:
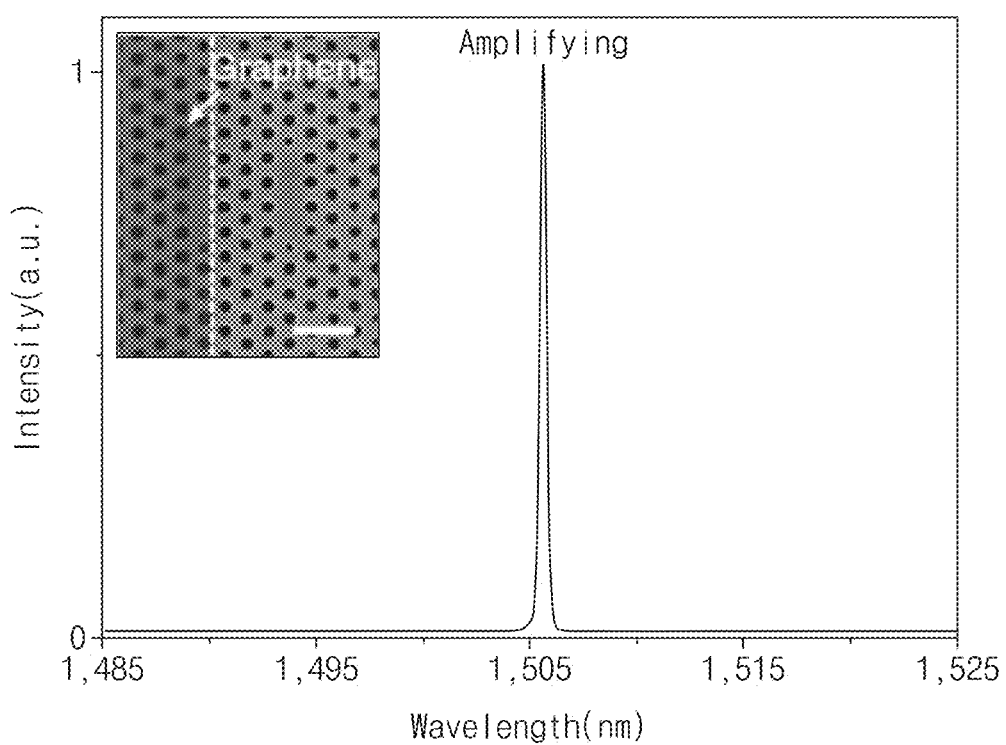
FIG. 6 illustrates an oscillation wavelength of the photonic crystal device in FIG. 5.

FIG. 6 illustrates an oscillation wavelength of the photonic crystal device in FIG. 5.

Figure 7:
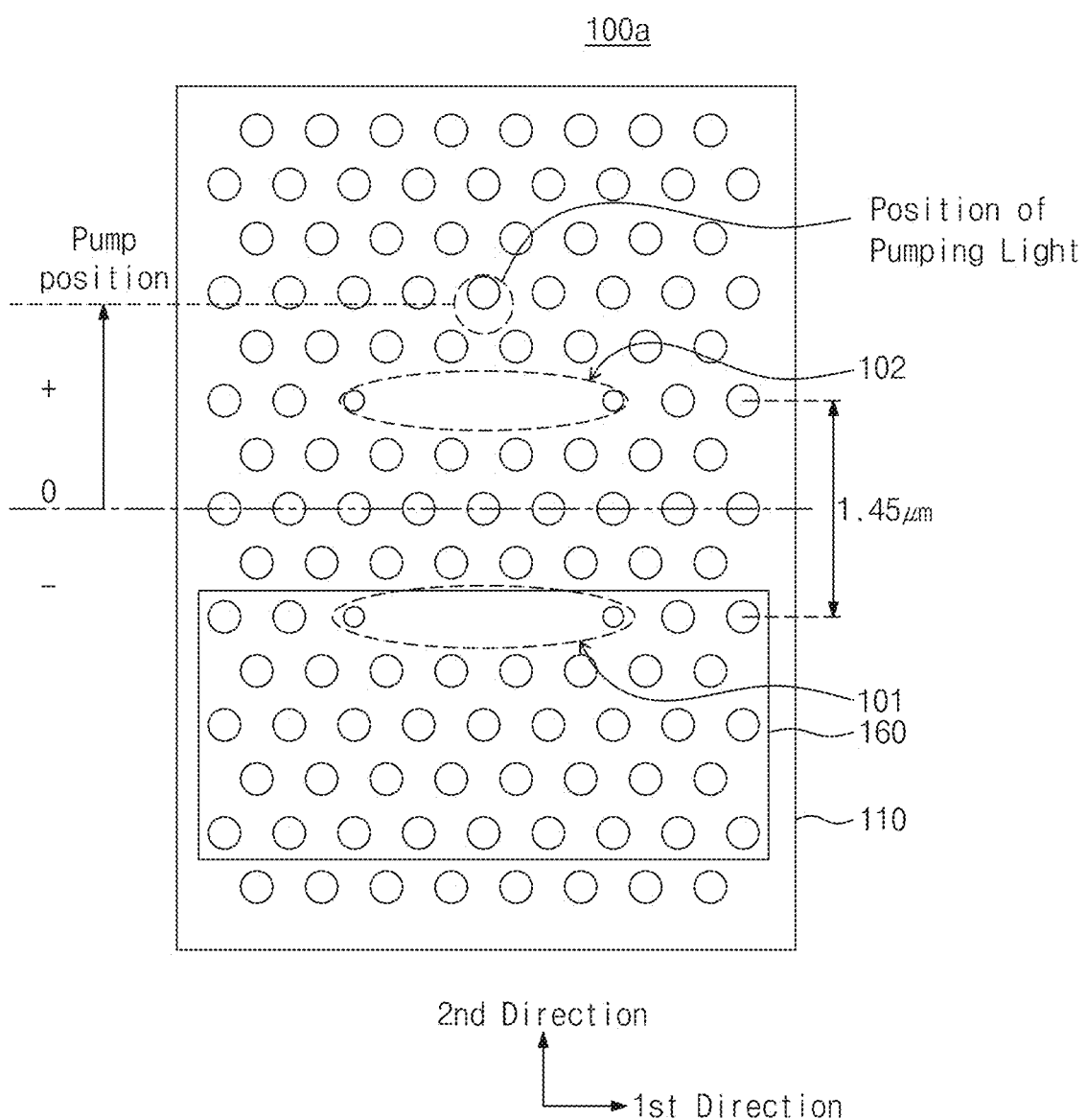
FIG. 7 is a top plan view illustrating a pumping position of a photonic crystal device whose two-third is covered with a graphene according to an example embodiment of the present disclosure.

FIG. 7 is a top plan view illustrating a pumping position of a photonic crystal device whose two-third is covered with a graphene according to an example embodiment of the present disclosure.

Figure 8:
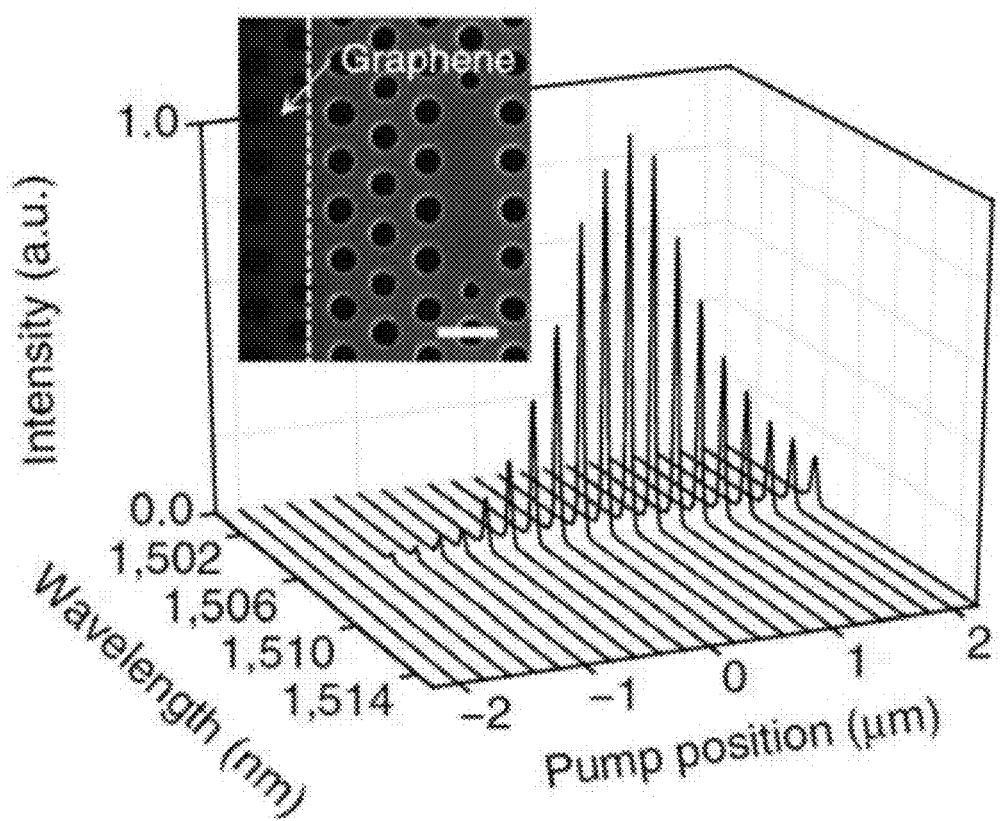
FIG. 8 illustrates oscillation wavelength and intensity of the photonic crystal device depending on the pumping position in FIG. 7.

FIG. 8 illustrates oscillation wavelength and intensity of the photonic crystal device depending on the pumping position in FIG. 7.

Referring to FIGS. 5 and 6, a photonic crystal device 100a includes a first photonic crystal resonator 101 and a second photonic crystal resonator 102 which are coupled to each other. A single-layer graphene layer 160 is disposed only on the first photonic crystal resonator 101 to provide different optical gains to the first photonic crystal resonator 101 and the second photonic crystal resonator 102. By covering a portion of the first photonic crystal resonator 101 with the graphene layer 160, the coupled first and second photonic crystal resonators 101 and 102 experience a great gain contrast. An optical gain of the first photonic crystal resonator 101 is reduced by an optical loss of the graphene layer 160. An optical loss $K_{graphene}$ of the first photonic crystal resonator 101 increases with an area of covering the first photonic crystal resonator 101 with the graphene layer 160.

When two-third of the first photonic crystal resonator 101 is covered with the graphene layer 160, a single lasing peak is observed at 1505.6 nanometers while a pumping light of 980 nanometers is irradiated to the photonic crystal device 100a. This wavelength is between wavelengths of a bonding lasing mode and an anti-bonding lasing mode.

Referring to FIGS. 7 and 8, when two-third of the first photonic crystal resonator 101 is covered with the graphene layer 160, a single lasing peak is obtained at 1505.6 nanometers while a pumping light of 980 nanometers is irradiated to the photonic crystal device 100a. This wavelength does not vary depending on a pumping position.

Figure 9:
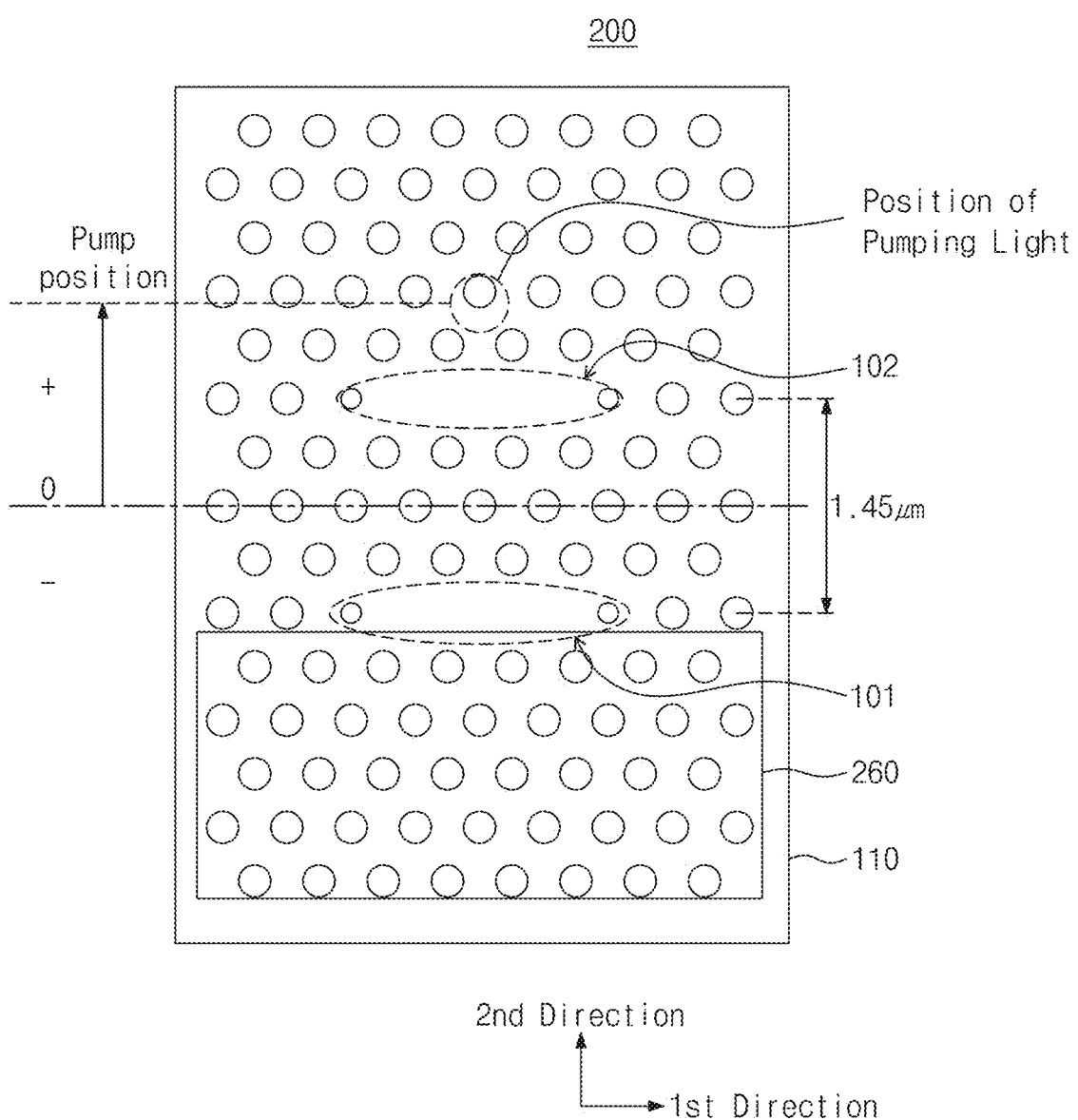
FIG. 9 is a top plan view illustrating a pumping position of a photonic crystal device whose one-third is covered with a graphene according to another example embodiment of the present disclosure.

FIG. 9 is a top plan view illustrating a pumping position of a photonic crystal device whose one-third is covered with a graphene according to another example embodiment of the present disclosure.

Figure 10:
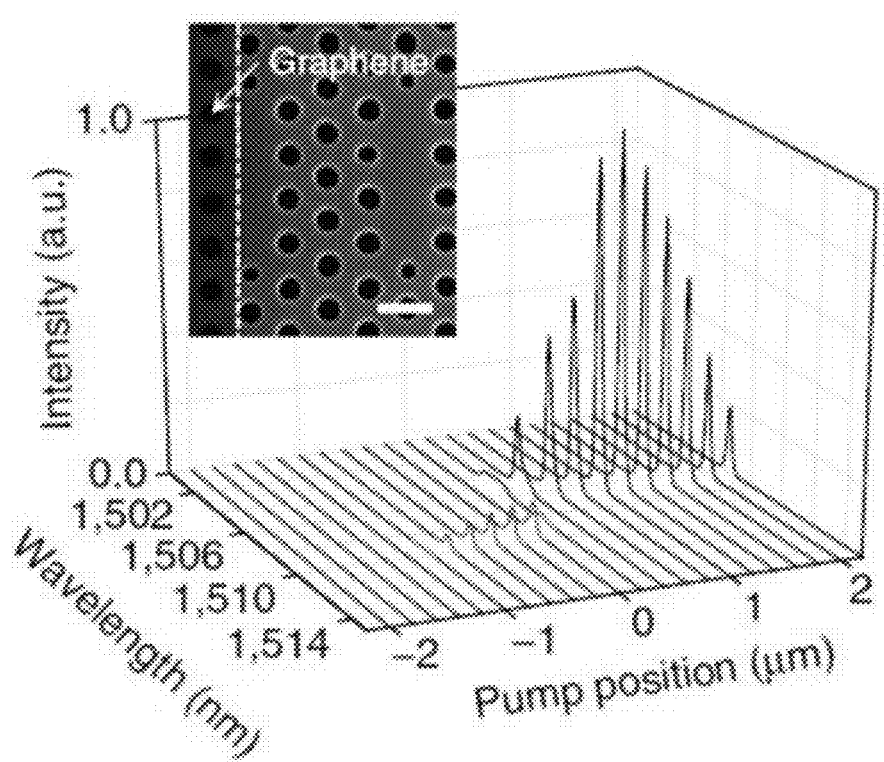
FIG. 10 illustrates oscillation wavelength and intensity of the photonic crystal device depending on the pumping position in FIG. 10.

FIG. 10 illustrates oscillation wavelength and intensity of the photonic crystal device depending on the pumping position in FIG. 10.

Referring to FIGS. 9 and 10, a photonic crystal device 200 includes a first photonic crystal resonator 101 and a second photonic crystal resonator 102 which are coupled to each other. When one-third of the first photonic crystal resonator 101 is covered with a graphene layer 260, two lasing peaks are observed near 1505 nanometers and 1510 nanometers while a pumping light of 980 nanometers is irradiated to the photonic crystal device 200. The lasing peak near 1505 nanometers is observed at a positive pumping position, and the lasing peak near 1510 nanometers is observed at a negative pumping position. A wavelength of 1505 nanometers varies depending on a pumping position. The lasing peak of 1510 nanometers lased at the negative pumping position is interpreted as an anti-bonding mode. The lasing peak of 1505 nanometers lased at the positive pumping position is interpreted as a bonding mode. The lasing peak of 1506 nanometers exhibits maximum intensity at a positive pumping position of 1.2 micrometer. The lasing peak of 1506 nanometers lased to the pumping position is interpreted as an amplification mode.

Figure 11A:
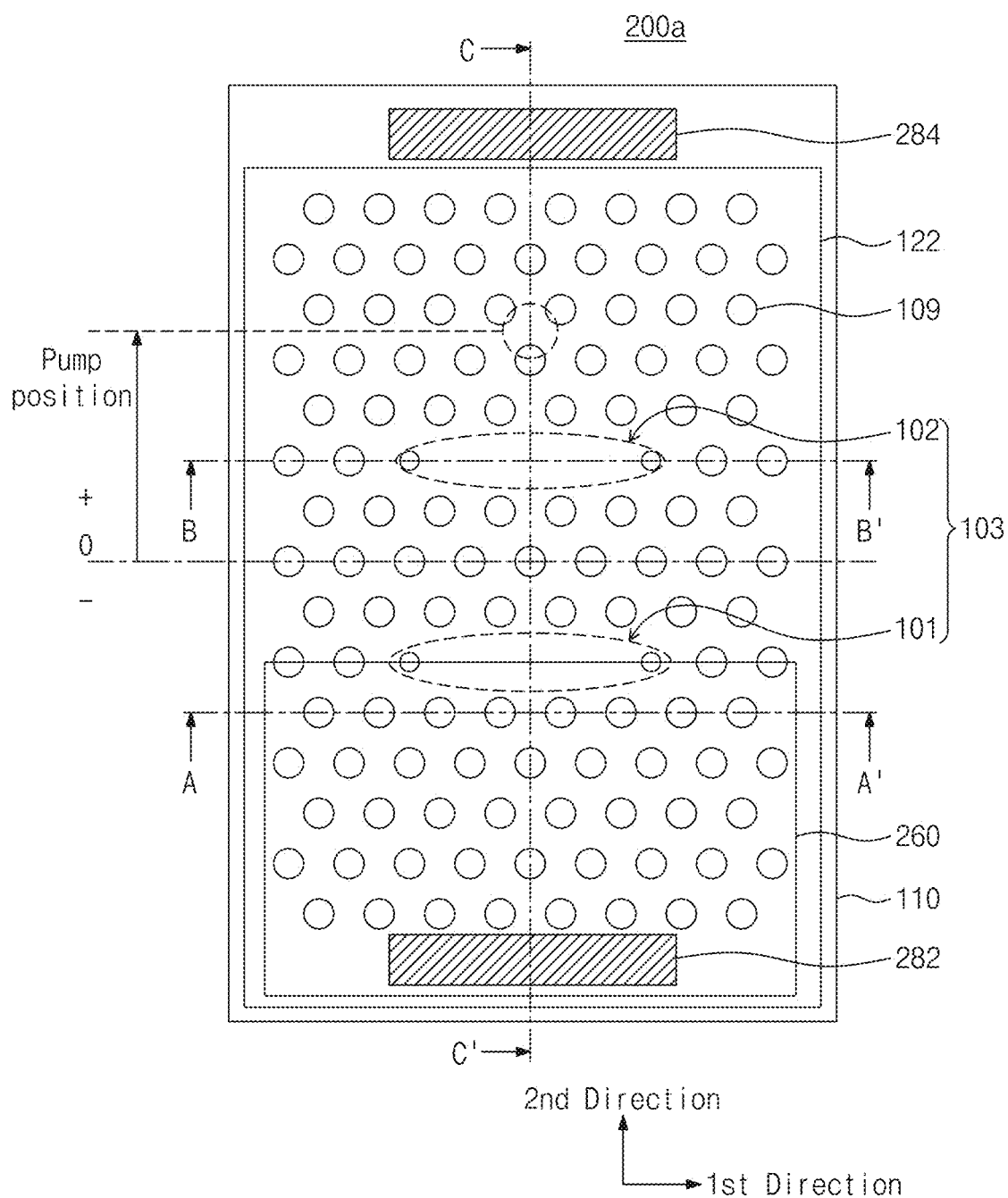
FIG. 11A is a top plan view of a photonic crystal device according to another example embodiment of the present disclosure.

FIG. 11A is a top plan view of a photonic crystal device according to another example embodiment of the present disclosure.

Figure 11B:
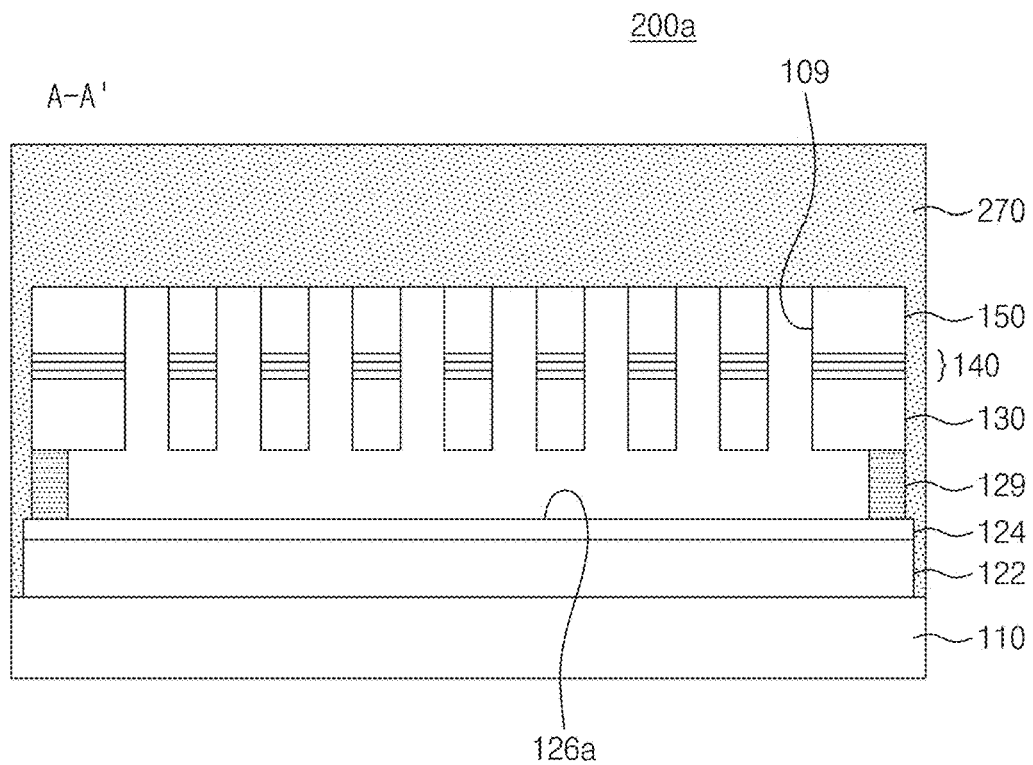
FIG. 11B is a cross-sectional view taken along a line A-A' in FIG. 11A.

FIG. 11B is a cross-sectional view taken along a line A-A' in FIG. 11A.

Figure 11C:
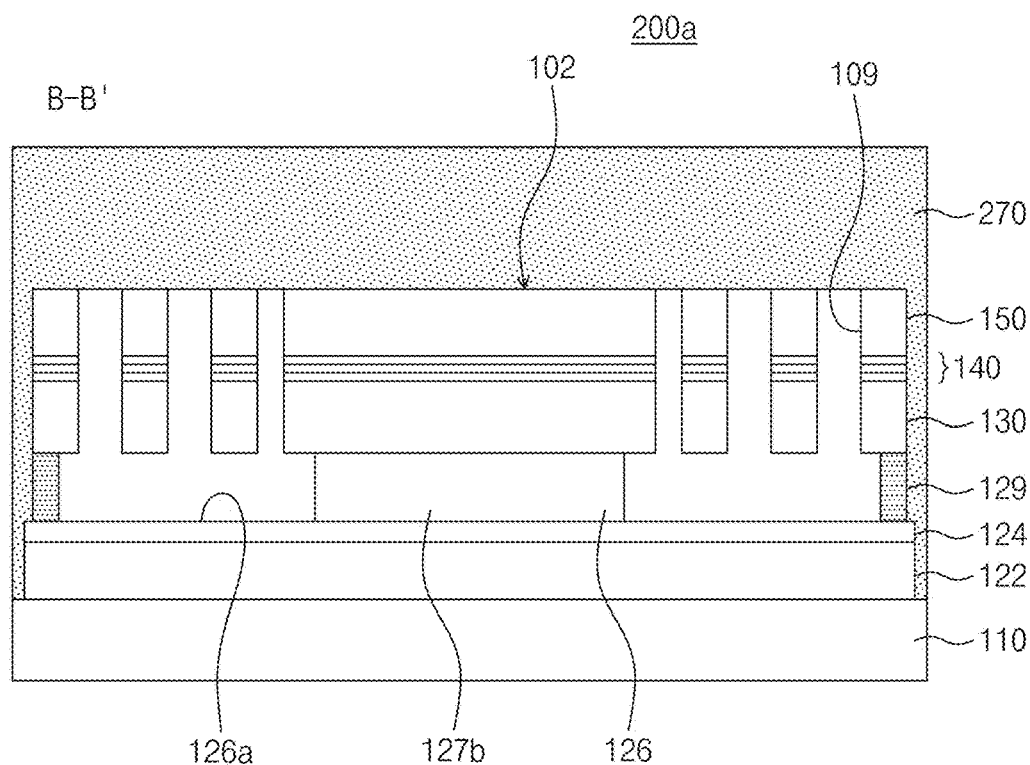
FIG. 11C is a cross-sectional view taken along a line B-B' in FIG. 11A.

FIG. 11C is a cross-sectional view taken along a line B-B' in FIG. 11A.

Figure 11D:
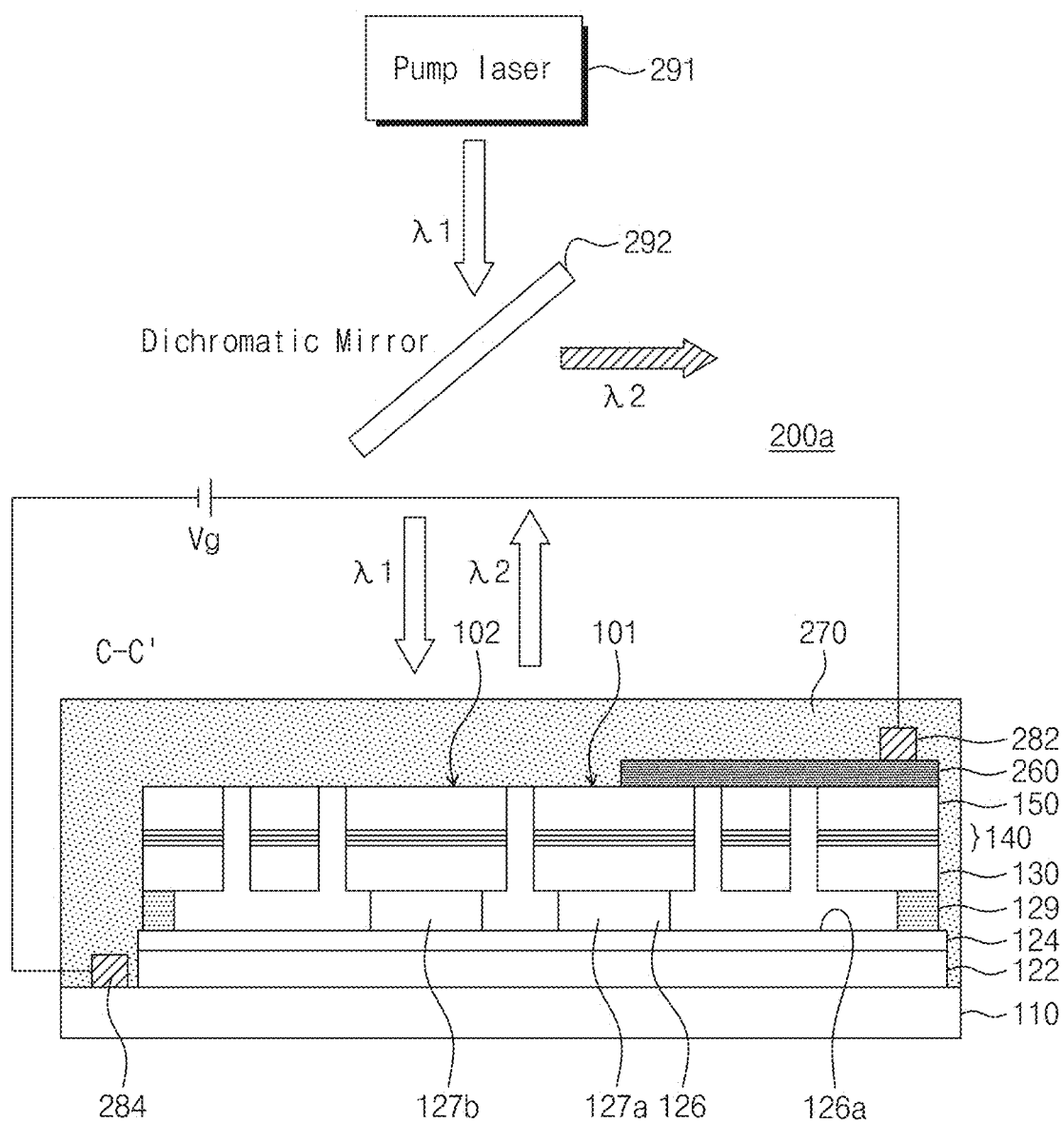
FIG. 11D is a cross-sectional view taken along a line C-C' in FIG. 11A.

FIG. 11D is a cross-sectional view taken along a line C-C' in FIG. 11A.

Referring to FIGS. 11A through 11D, a photonic crystal device 200a includes a two-dimensional photonic crystal 103 including a gain medium and having a first photonic crystal resonator 101 and a second photonic crystal resonator 102 which are spaced apart from each other in a second direction; and a graphene layer 260 disposed to cover a portion of the first photonic crystal resonator 101 and not to cover the second photonic crystal resonator 102. The graphene layer 260 may cover one-third of the first photonic crystal resonator 101.

The two-dimensional photonic crystal 103 is disposed on a disposition plane defined by a first direction (x-axis) and a second direction (y-axis). The two-dimensional photonic crystal 103 includes a plurality of holes 109 arranged on the disposition plane. The holes 109 may have a triangular lattice structure. Each of the first and second photonic crystal resonators 101 and 102 may have a structure in which three holes arranged adjacent to each other in the first direction are removed and a pair of small holes are arranged in the first direction. The first photonic crystal resonator 101 and the second photonic crystal resonator 102 have the same structure.

The photonic crystal 103 may include: a semiconductor substrate 122; an etch-stop layer 124 grown as a crystal on the semiconductor substrate 122; a lower sacrificial semiconductor layer 126 grown as a crystal on the etch-stop layer 124; a first semiconductor layer 130 of first conductivity type grown on the lower sacrificial semiconductor layer 126; an active semiconductor layer 140 disposed on the first semiconductor layer 130; and a second semiconductor layer 150 of second conductivity type disposed on the active semiconductor layer 140.

The holes 109 may penetrate the first semiconductor layer 130, the active semiconductor layer 140, and the second semiconductor layer 150. The holes 109 may have the same diameter and may be two-dimensionally and periodically arranged to provide a photonic crystal. The holes 109 may have a triangular lattice structure. Lower surfaces of the holes 109 may communicate with a cavity 126a that is formed in the lower sacrificial semiconductor layer 126 and is filled with air. The first photonic crystal resonator 101 may include a first post 127a formed in the lower sacrificial semiconductor layer 126. The second photonic crystal resonator 102 may include a second post 127b formed in the lower sacrificial semiconductor layer 126. Each of the first and second photonic crystal resonators 101 and 102 may be formed such that some of periodically arranged holes are removed or diameters of the holes are made relatively small. The first post 127a and the second post 127b may be regions in which the lower sacrificial semiconductor layer 126 is not removed by wet etching. The gain medium may be the active semiconductor layer 140.

An insulating support 129 may fill the cavity 122a formed by removing the lower sacrificial semiconductor layer 126. The insulating support 129 may be a photoresist. The lower sacrificial semiconductor layer 126 may be patterned by anisotropic etching for forming the holes. The patterned lower sacrificial semiconductor layer 126 is removed by wet etching, except for the first post 127a and the second post 127b, to form a cavity. An insulating support layer may be formed by spin coating on a substrate where the cavity and the holes are formed. The insulating support layer may conformally cover the substrate and may penetrate an edge of the cavity. Then, the substrate may be anisotropically etched to remove the exposed insulating support layer and the insulating support layer penetrating the inside of the cavity may form the insulating support.

The first semiconductor layer 130, the active semiconductor layer 140, and the second semiconductor layer 150 may provide a p-i-n diode structure. The active semiconductor layer 140 may be an intrinsic semiconductor region.

The semiconductor substrate 110 may be an InP substrate doped with p-type impurities, the etch-stop layer 122 may be an InGaAs layer doped with p-type impurities, and the lower sacrificial semiconductor layer 126 may be an InP layer doped with p-type impurities.

The first semiconductor layer 130 of the first conductivity type may be an InGaAsP layer doped with p-type impurities, and the active semiconductor layer 140 may be a quantum well structure including an undoped InGaAsP layer. The second semiconductor layer 150 of the second conductivity type may be an InGaAsP layer doped with n-type impurities.

The active semiconductor layer 140 may include a 1.24Q InGaAsP layer, a 1.30Q InGaAsP layer, a 1.65Q InGaAsP layer, a 1.30Q InGaAsP layer, and a 1.24Q InGaAsP layer which are sequentially stacked. The 1.24Q InGaAsP layer is an InGaAsP layer with a mole fraction to have a luminescence of 1.24 micrometer. More specifically, the 1.24Q InGaAsP layer may be $In_{0.76}Ga_{0.24}As_{0.85}P_{0.15}$. The 1.65Q InGaAsP layer may be an InGaAsP layer with a mole fraction to have a luminescence of 1.65 micrometer.

The cavity 126a formed in the lower sacrificial semiconductor layer 126 and filled with air may be formed on the etch-stop layer 124 by wet-etching the lower sacrificial semiconductor layer 126. In the first photonic crystal resonator 101, the lower sacrificial semiconductor layer 126 may not be locally etched and may provide a first post 127a. In the second photonic crystal resonator 102, the lower sacrificial semiconductor layer 126 may not be etched and may provide a second post 126b.

The graphene layer 260 may be disposed on the second semiconductor layer 150 of the second conductivity type to control an optical loss of the first photonic crystal resonator 101. The graphene layer 260 may be a single graphene layer and may be formed by chemical vapor deposition (CVD) or the like to be transferred onto the second semiconductor layer 150.

A control electrode 282 may be locally disposed on the graphene layer 260 and may apply a voltage to the graphene layer 260 to electrically control light absorption characteristics of the graphene layer 260. The control electrode 282 may be disposed in a region in which the holes are not disposed. The control electrode 282 may apply a voltage to the graphene layer 260, and the first photonic crystal resonator 101 and the second photonic crystal resonator 102 may oscillate to bonding natural mode/anti-bonding natural mode or single natural mode. The control electrode 282 may include a Ti/Au thin film.

An auxiliary substrate 110 may be disposed below the semiconductor substrate 122. The auxiliary substrate 110 may be a glass substrate or a plastic substrate. The auxiliary substrate 110 may include a region that is not covered with the semiconductor substrate 122.

An auxiliary substrate electrode 284 may be exposed and disposed on the auxiliary substrate 110. The auxiliary substrate electrode 284 may include a Ti/Au thin film.

An ion-gel 270 may be disposed to cover the auxiliary substrate electrode 284, the control electrode 282, and the graphene layer 260 and may provide electrical connection between the auxiliary substrate electrode 284 and the control electrode 282. The ion-gel 270 may include an ion-conductive polymer.

The first photonic crystal resonator 101 and the second photonic crystal resonator 102 may oscillate to bonding natural mode/anti-bonding natural mode or single natural mode according to a position of a pumping light depending on a line connecting the first and second photonic crystal resonators 101 and 102. An external pumping light source 291 may provide a pumping light between the first photonic crystal resonator 101 and the second photonic crystal resonator 102. An output light of the external pumping light source 291 may pass through a dichromatic mirror 292 to be provided to the photonic crystal device 200. The output light lased by the pumping light is output perpendicularly to a disposition plane of the photonic crystal device 200 to be reflected on the dichromatic mirror 292.

Figure 12:
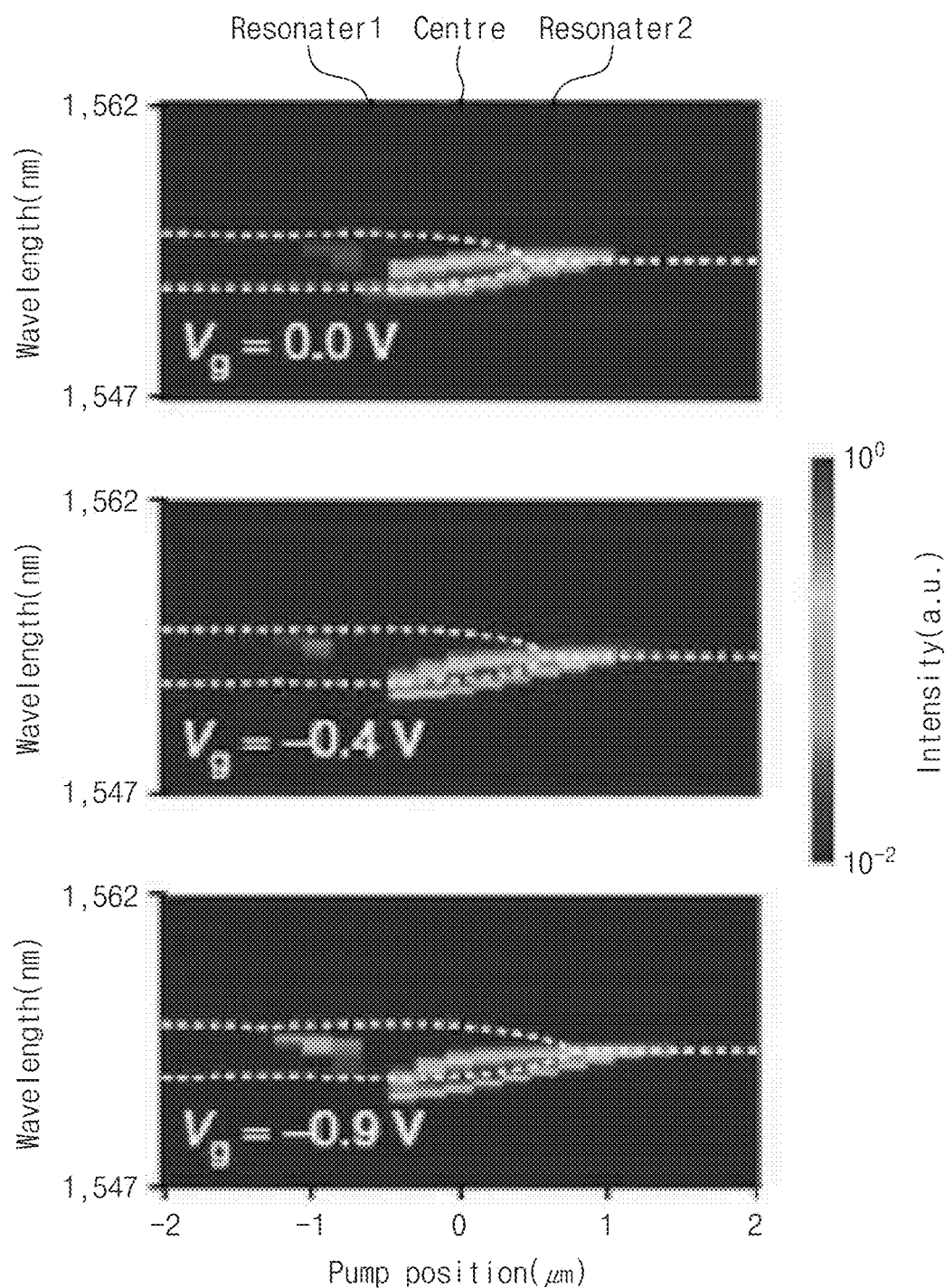
FIG. 12 shows a result illustrating a wavelength depending on a pumping position of a photonic crystal device according an example embodiment of the present disclosure.

FIG. 12 shows a result illustrating a wavelength depending on a pumping position of a photonic crystal device according an example embodiment of the present disclosure.

Figure 13:
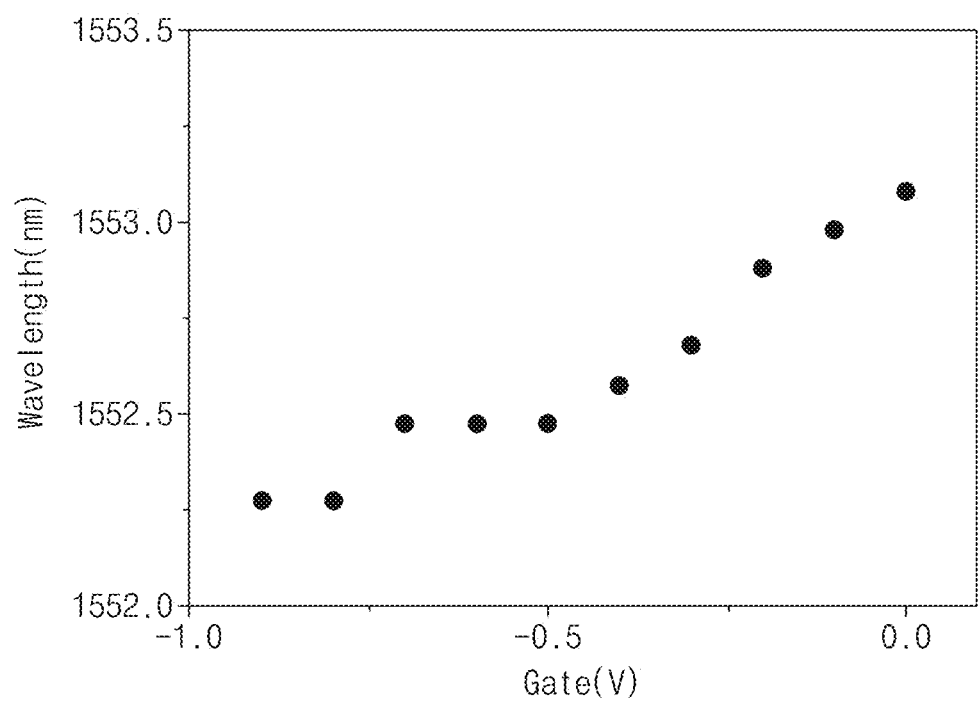
FIG. 13 shows a result illustrating a wavelength depending on a voltage of a control electrode at a fixed pumping position according to an example embodiment of the present disclosure.

FIG. 13 shows a result illustrating a wavelength depending on a voltage of a control electrode at a fixed pumping position according to an example embodiment of the present disclosure.

Referring to FIGS. 11A through 11D and FIGS. 12 and 13, an exceptional point may be controlled by controlling an optical loss $K_{graphene}$ of the graphene layer 260 through electrical gating of the control electrode 282. The ion-gel 270 is disposed on the first and second photonic crystal resonators 101 and 102, and a portion of the first photonic crystal resonator 101 is covered with a graphene.

A pump laser of the external pumping light source 291 has maximum pump power of 843 milliwatts and is canned from −2.0 micrometer to +2.0 micrometers. Wavelengths of measured resonance peaks vary depending on a pumping position and a gate voltage.

A scanning photoluminescence was measured. A gate voltage Vg of the electrode 282 is applied to the graphene layer 260 by using the ion-gel 270.

To estimate an exceptional point of another gate voltage, a light transmission of graphene/ion-gel was measured while changing the gate voltage Vg from 0 V to −1.1 V. The optical loss $K_{graphene}$ of the graphene layer 260 is 0.20, 0.17, and 0.13 THz with respect to gate voltages of 0.0 V, −0.4 V, and −0.9V, respectively. A position of the exceptional point is 0.45, 0.47, and 0.75 micrometer with respect to the gate voltages of 0.0 V, −0.4 V, and −0.9V, respectively. A pumping position for the exceptional point increases as an absolute value of the gate voltage Vg increases or the optical loss $K_{graphene}$ of the graphene layer 260 decreases.

Referring to FIG. 13, at a pumping position of −0.4 micrometer, an oscillation wavelength varies depending on the gate voltage Vg. When the gate voltage Vg changes from 0 V to −0.9V, a wavelength of peak intensity changes from 1553.1 nanometers to 1552.3 nanometers. Thus, the photonic crystal device 200a may be used as a tunable optical device.

Figure 14A:
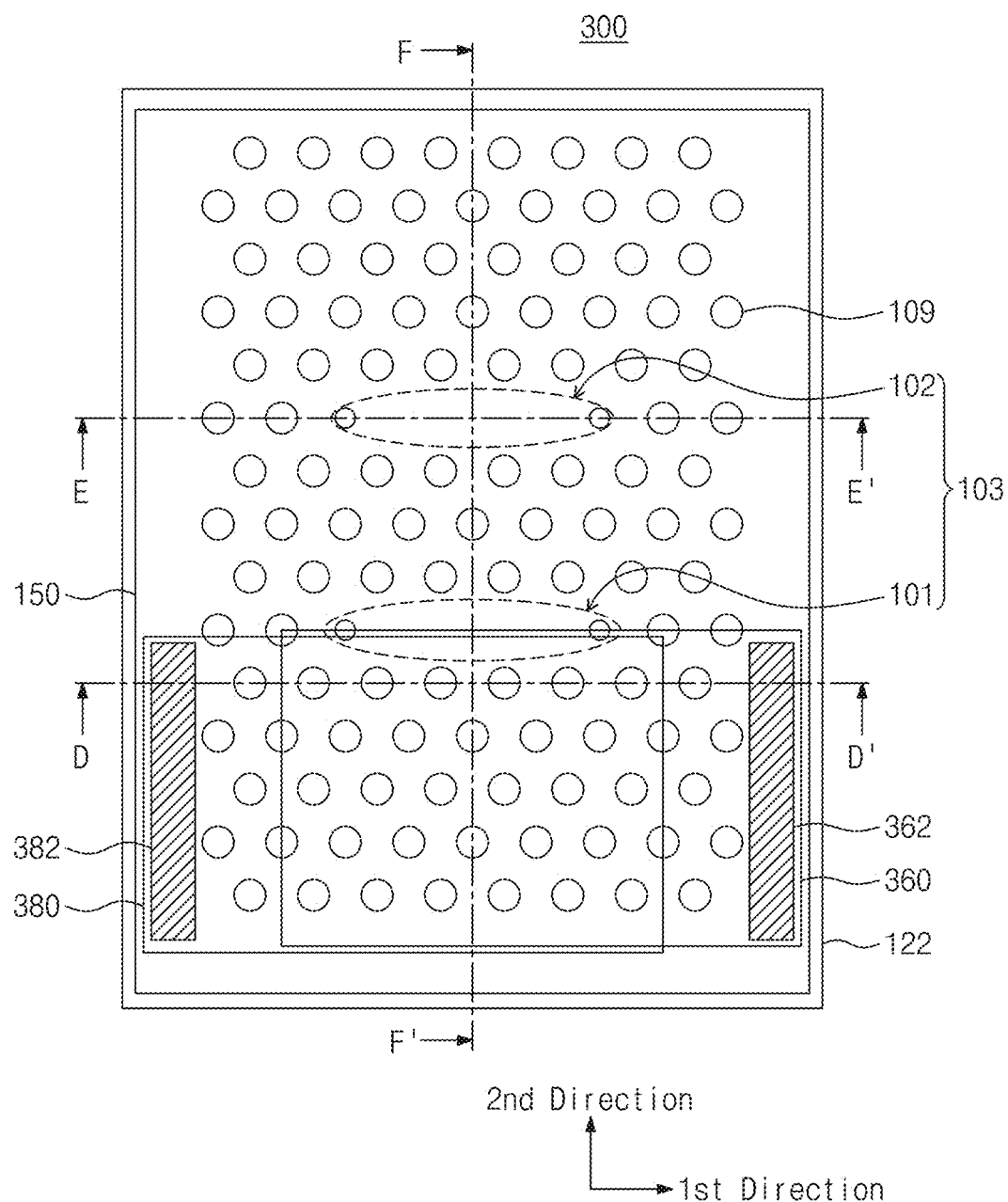
FIG. 14A is a top plan view of a photonic crystal device according to another example embodiment of the present disclosure.

FIG. 14A is a top plan view of a photonic crystal device according to another example embodiment of the present disclosure.

Figure 14B:
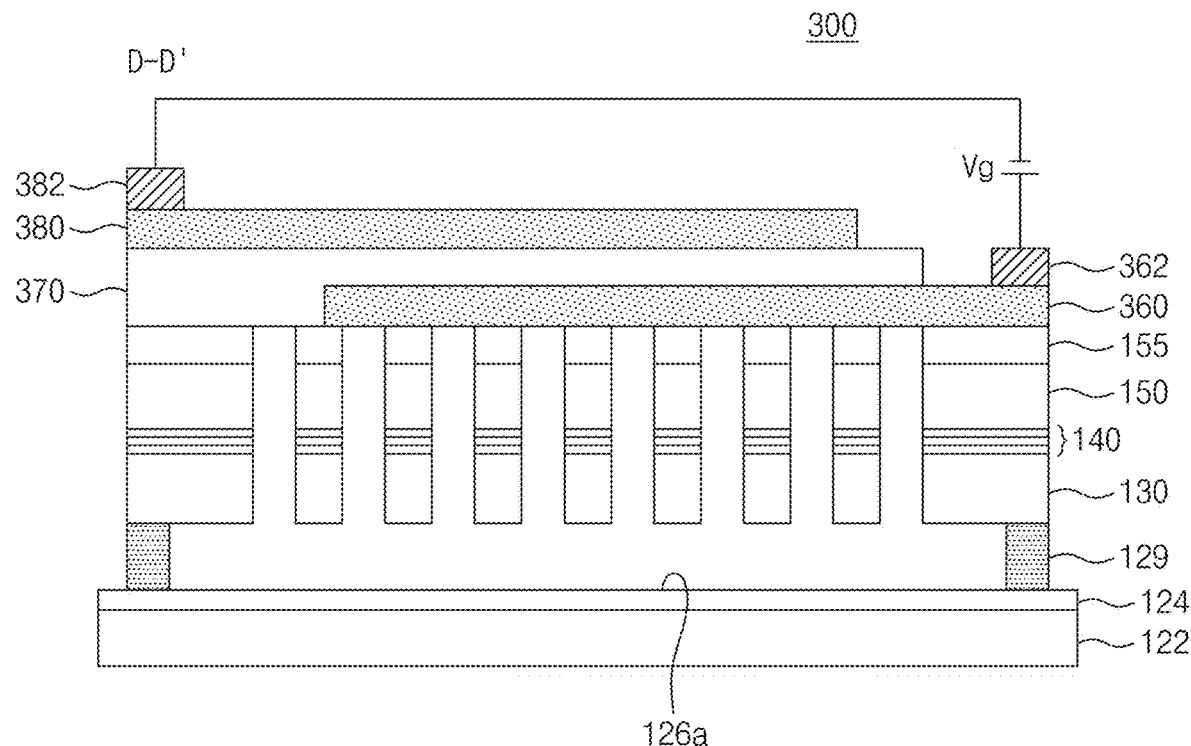
FIG. 14B is a cross-sectional view taken along a line D-D' in FIG. 14A.

FIG. 14B is a cross-sectional view taken along a line D-D' in FIG. 14A.

Figure 14C:
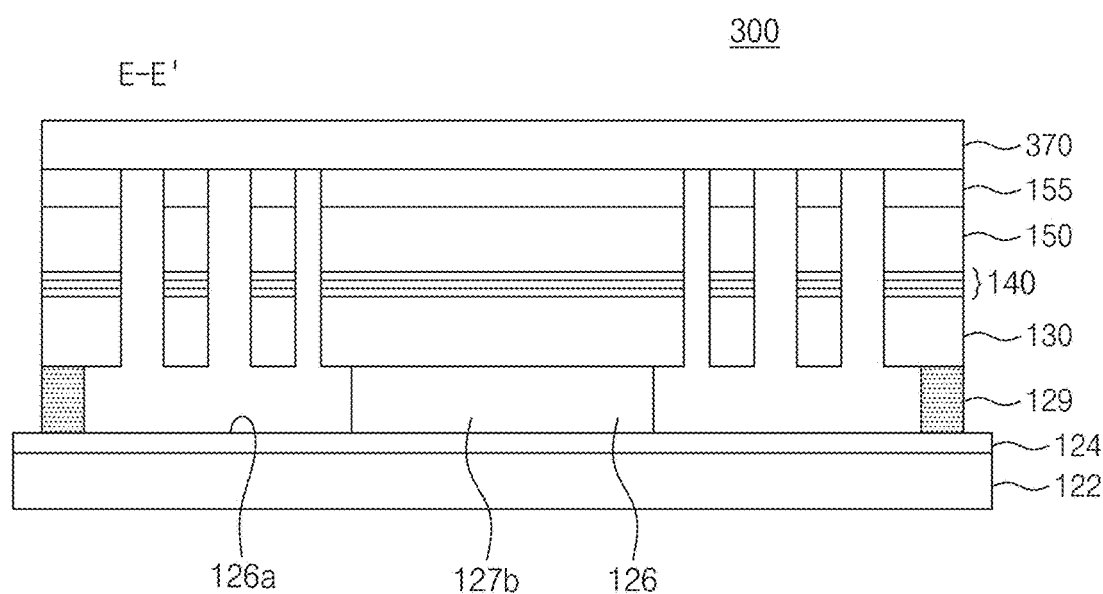
FIG. 14C is a cross-sectional view taken along a line E-E' in FIG. 14A.

FIG. 14C is a cross-sectional view taken along a line E-E' in FIG. 14A.

Figure 14D:
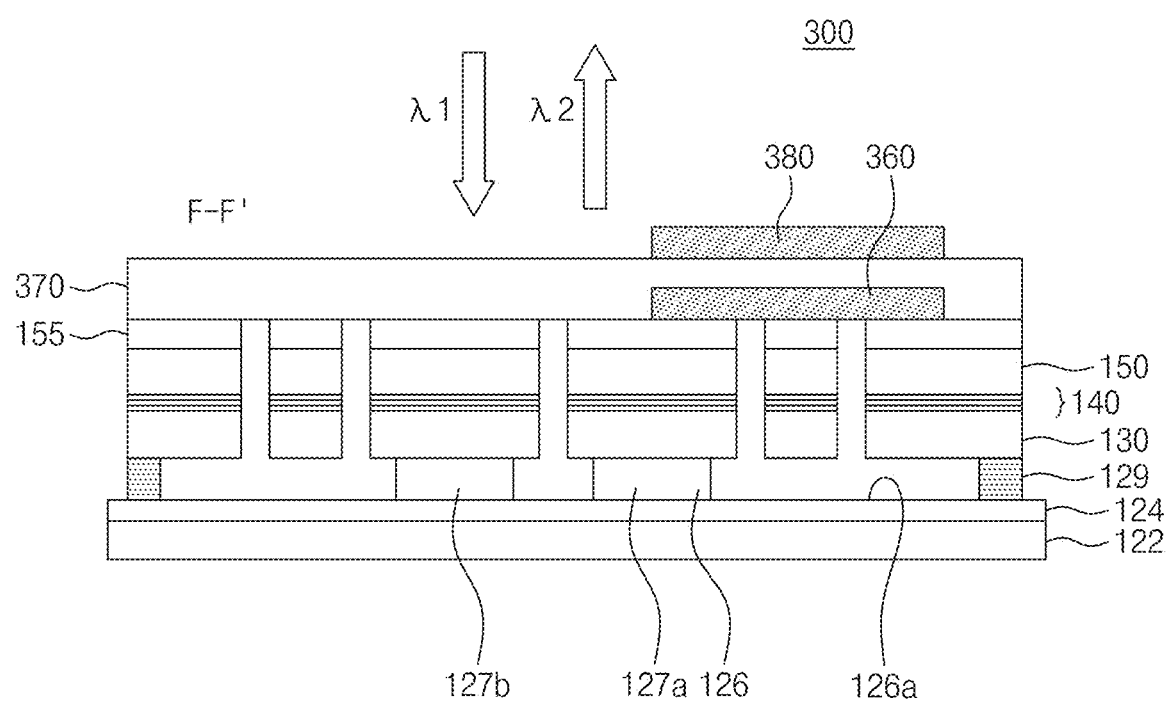
FIG. 14D is a cross-sectional view taken along a line F-F' in FIG. 14A.

FIG. 14D is a cross-sectional view taken along a line F-F' in FIG. 14A.

Referring to FIGS. 14A through 14D, a photonic crystal device 300 includes a two-dimensional photonic crystal 103 including a gain medium and having a first photonic crystal resonator 101 and a second photonic crystal resonator 102 which are spaced apart from each other in a second direction, and graphene layers 360 and 380 disposed to cover a portion of the first photonic crystal resonator 101 and not to cover the second photonic crystal resonator 102. The graphene layer 360 and 380 may cover one-third of the first photonic crystal resonator 101.

The two-dimensional photonic crystal 103 is disposed on a disposition plane defined by a first direction (x-axis) and a second direction (y-axis). The two-dimensional photonic crystal 103 includes a plurality of holes 109 arranged on the disposition plane. The holes 109 may have a triangular lattice structure. Each of the first and second photonic crystal resonators 101 and 102 may have a structure in which three holes arranged adjacent to each other in the first direction are removed and a pair of small holes are arranged in the first direction. The first photonic crystal resonator 101 and the second photonic crystal resonator 102 have the same structure.

The photonic crystal 103 may include: a semiconductor substrate 122; an etch-stop layer 124 grown as a crystal on the semiconductor substrate 122; a lower sacrificial semiconductor layer 126 grown as a crystal on the etch-stop layer 124; a first semiconductor layer 130 of first conductivity type grown on the lower sacrificial semiconductor layer 126; an active semiconductor layer 140 disposed on the first semiconductor layer 130; and a second semiconductor layer 150 of second conductivity type disposed on the active semiconductor layer 140. An insulating support 129 may fill an edge of a cavity 126a formed by removing the lower sacrificial semiconductor layer 126.

An insulating layer 155 may be disposed on the second semiconductor layer 150 of the second conductivity type. The insulating layer 155 may include silicon oxide, aluminum oxide, boron nitride (BN) or hafnium oxide. The insulating layer 155 may electrically insulate the first graphene layer 360 and the second semiconductor layer 150 from each other.

The holes 109 may penetrate the first semiconductor layer 130, the active semiconductor layer 140, the second semiconductor layer 150, and the insulating layer 155. The holes 109 may have the same diameter and may be two-dimensionally and periodically arranged to provide a photonic crystal. Lower surfaces of the holes 109 may communicate with the cavity 126a that is formed in the lower sacrificial semiconductor layer 126 and is filled with air. The first photonic crystal resonator 101 may include a first post 127a formed in the lower sacrificial semiconductor layer 126. The second photonic crystal resonator 102 may include a second post 127b formed in the lower sacrificial semiconductor layer 126. Each of the first and second photonic crystal resonators 101 and 102 may be formed such that some of periodically arranged holes are removed or diameters of the holes are made relatively small. The first post 127a and the second post 127b may be regions in which the lower sacrificial semiconductor layer 126 is not removed by wet etching.

The first semiconductor layer 130, the active semiconductor layer 140, and the second semiconductor layer 150 may provide a p-i-n diode structure. The active semiconductor layer 140 may be an intrinsic semiconductor region.

The semiconductor substrate 110 may be an InP substrate doped with p-type impurities, the etch-stop layer 122 may be an InGaAs layer doped with p-type impurities, and the lower sacrificial semiconductor layer 126 may be an InP layer doped with p-type impurities.

The first semiconductor layer 130 of the first conductivity type may be an InGaAsP layer doped with p-type impurities, and the active semiconductor layer 140 may be a quantum well structure including an undoped InGaAsP layer. The second semiconductor layer 150 of the second conductivity type may be an InGaAsP layer doped with n-type impurities. The active semiconductor layer 140 may operate as a gain medium.

The active semiconductor layer 140 may include a 1.24Q InGaAsP layer, 1.30Q InGaAsP layer, a 1.65Q InGaAsP layer, a 1.30Q InGaAsP layer, and a 1.24Q InGaAsP layer which are sequentially stacked. The active semiconductor layer 140 may have a single quantum well structure or a multiple quantum well structure. The 1.24Q InGaAsP layer is an InGaAsP layer with a mole fraction to have a luminescence of 1.24 micrometer. More specifically, the 1.24Q InGaAsP layer may be $In_{0.76}Ga_{0.24}As_{0.85}P_{0.15}$. The 1.65Q InGaAsP layer may be an InGaAsP layer with a mole fraction to have a luminescence of 1.65 micrometer.

The cavity 126a formed in the lower sacrificial semiconductor layer 126 and filled with air may be formed on the etch-stop layer 124 by wet-etching the lower sacrificial semiconductor layer 126. In the first photonic crystal resonator 101, the lower sacrificial semiconductor layer 126 may not be locally etched and may provide a first post 127a. In the second photonic crystal resonator 102, the lower sacrificial semiconductor layer 126 may not be etched and may provide a second post 126b.

The graphene layers 360 and 380 may be disposed on the second semiconductor layer 150 of the second conductivity type to control an optical loss of the first photonic crystal resonator 101. Each of the graphene layers 360 and 380 may be a single graphene layer and may be formed by chemical vapor deposition (CVD) or the like to be transferred onto the insulating layer 155.

A graphene layer includes a first graphene 360 disposed on the insulating layer 155 or the second semiconductor layer 150 to cover a portion of the first photonic crystal resonator 101; an interlayer dielectric 370 disposed on the first graphene layer 360; and a second graphene layer 380 disposed on the interlayer dielectric 370. A portion of the first graphene layer 360 may be exposed, and a portion of the second graphene layer 380 may be exposed.

Control electrodes 362 and 382 include a first control electrode 362 which is locally disposed on the first graphene layer 360 and is exposed; and a second control electrode 382 which is locally disposed on the second graphene layer 380 and is exposed. A voltage is applied between the first control electrode 362 and the second control electrode 382 to adjust light absorption rates of the first graphene layer 360 and the second graphene layer 380. The first control electrode 362 and the second control electrode 382 may be disposed on the left and right of a first direction where the holes 109 are not arranged, respectively. The first and second control electrodes 362 and 382 may include a Ti/Au thin film.

When a gate voltage is applied between the first control electrode 362 and the second control electrode 382, light absorption characteristics of the first graphene layer 360 and the second graphene layer 380 are electrically controlled by applying a voltage between the first graphene layer 360 and the second graphene layer 380. When a pumping light is provided, the first photonic crystal resonator 101 and the second photonic crystal resonator 102 may oscillate to bonding natural mode/anti-bonding natural mode or single natural mode. In addition, an oscillation wavelength may vary depending on the voltage of the first and second control electrodes 362 and 382.

Figure 15A:
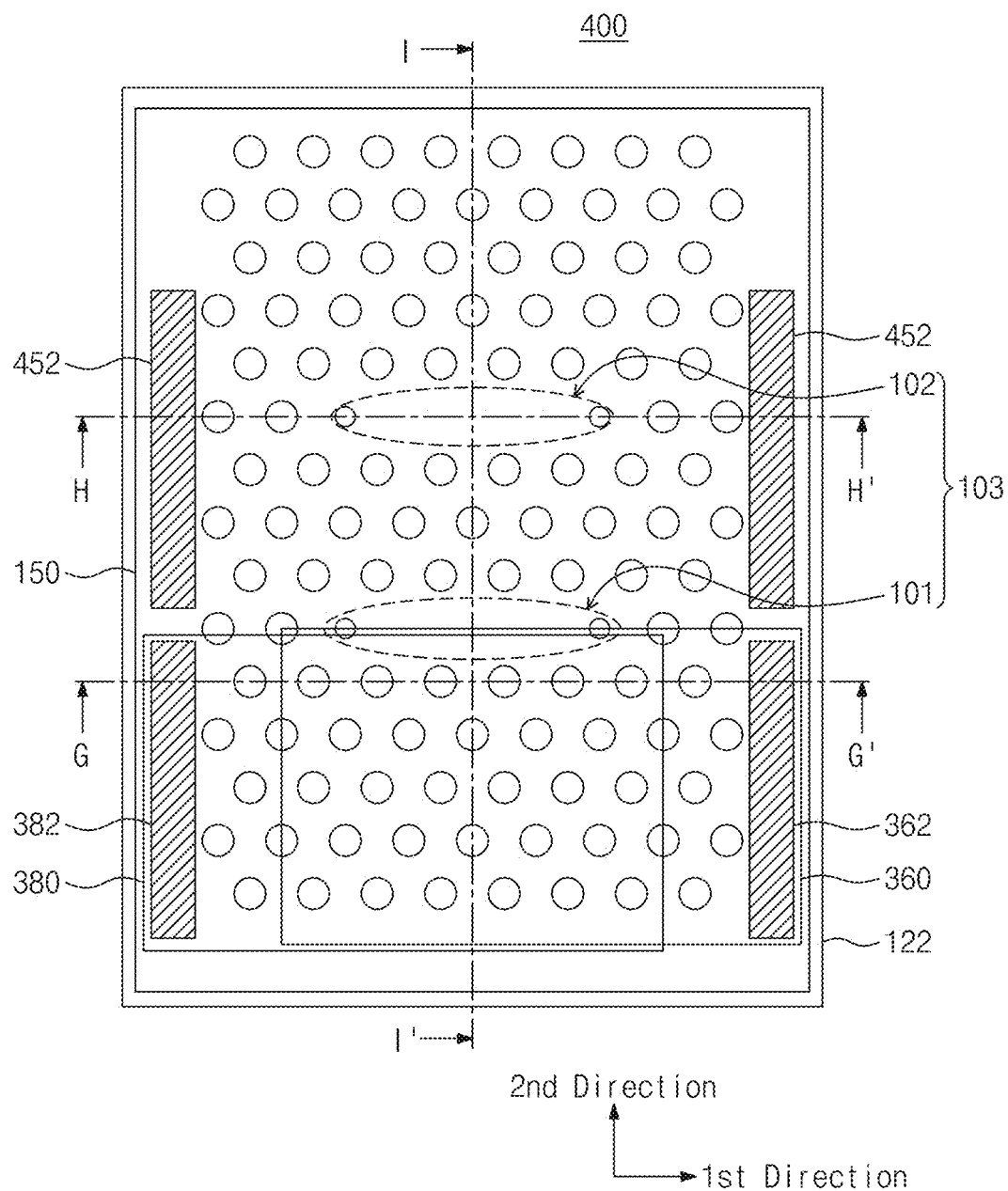
FIG. 15A is a top plan view of a photonic crystal device according to another example embodiment of the present disclosure.

FIG. 15A is a top plan view of a photonic crystal device according to another example embodiment of the present disclosure.

Figure 15B:
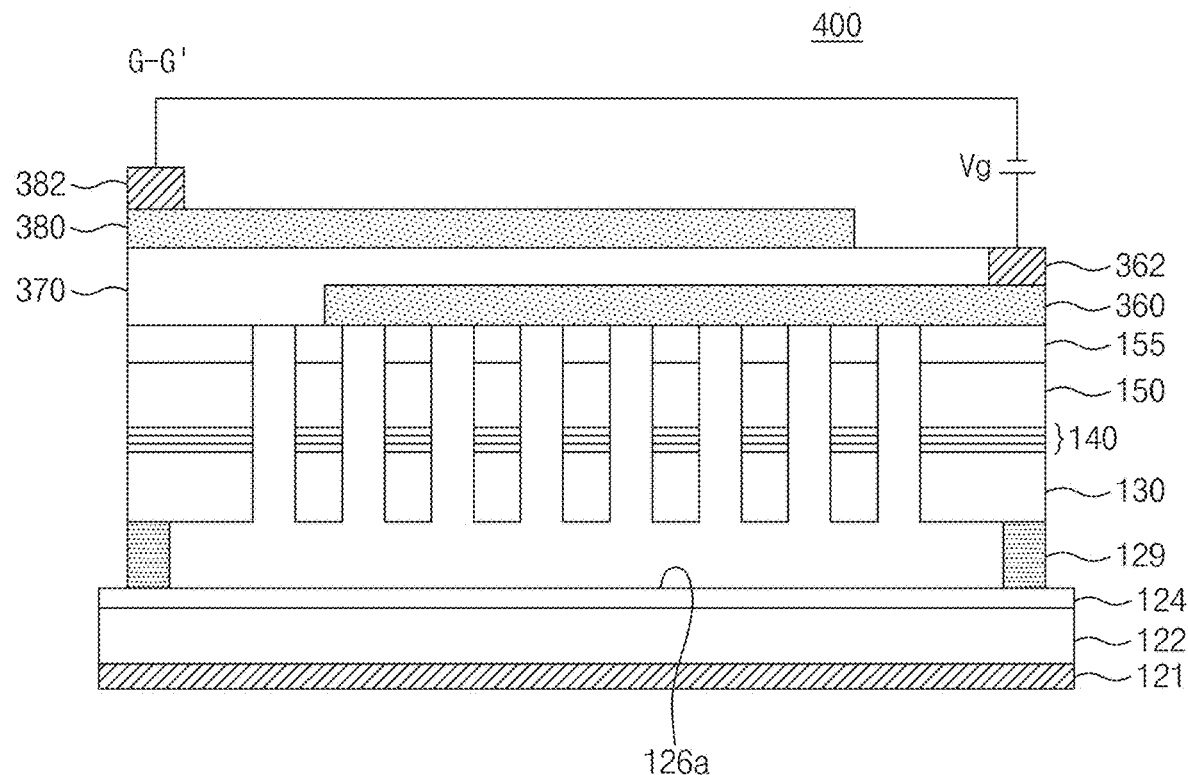
FIG. 15B is a cross-sectional view taken along a line G-G' in FIG. 15A.

FIG. 15B is a cross-sectional view taken along a line G-G' in FIG. 15A.

Figure 15C:
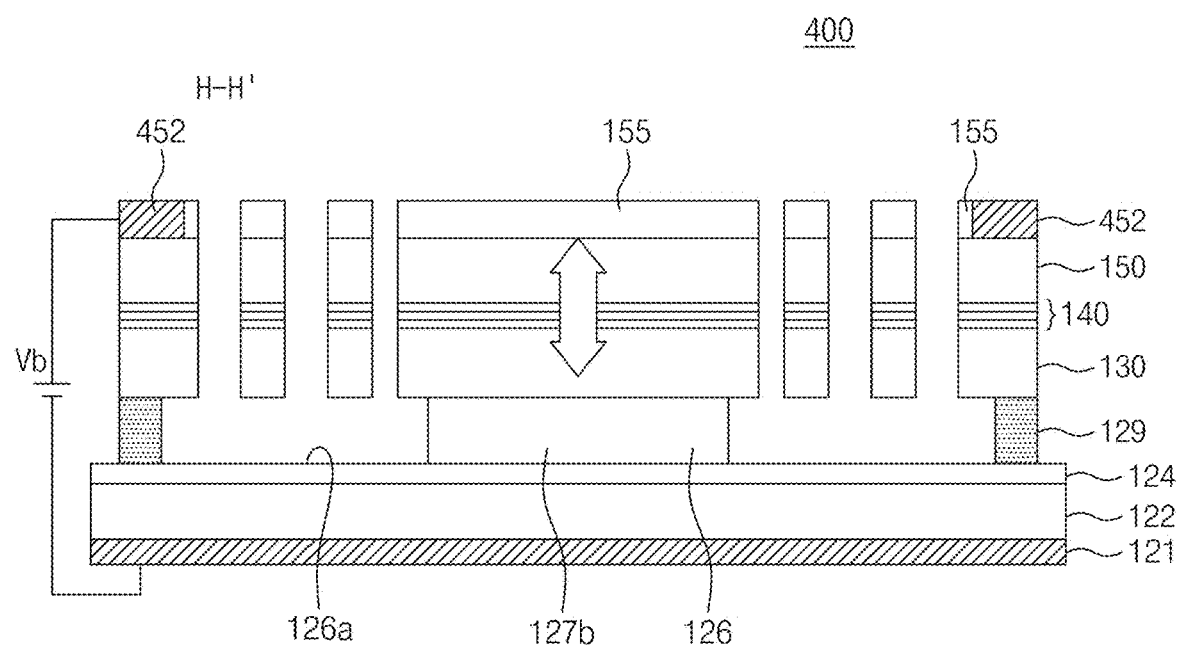
FIG. 15C is a cross-sectional view taken along a line H-H' in FIG. 15A.

FIG. 15C is a cross-sectional view taken along a line H-H' in FIG. 15A.

Figure 15D:
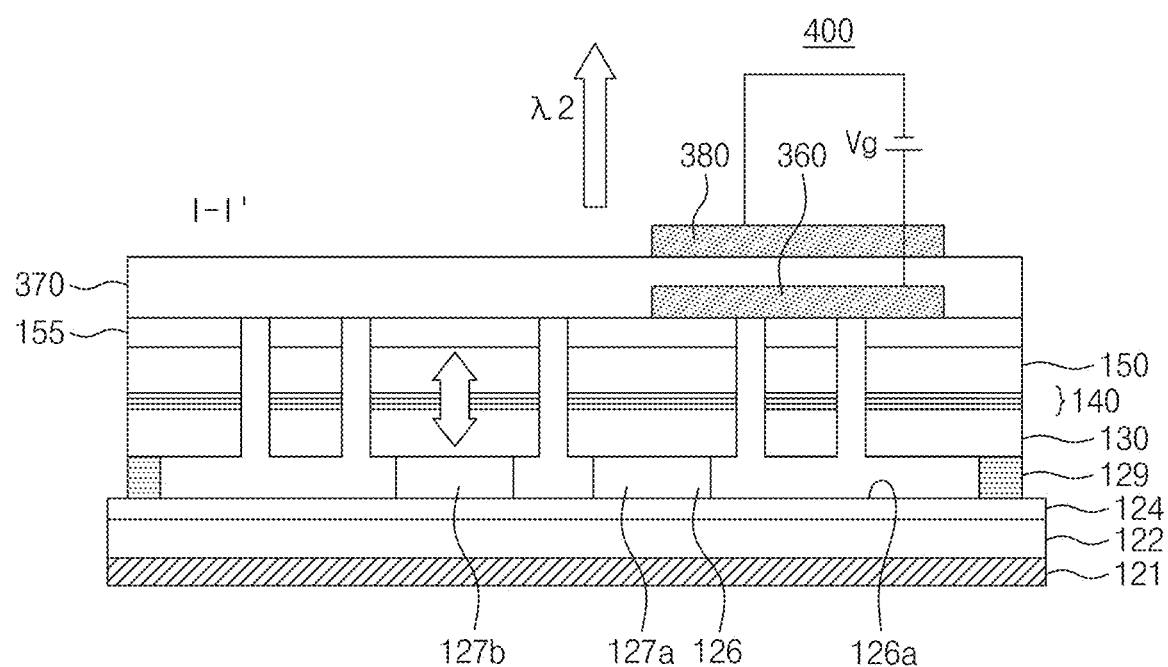
FIG. 15D is a cross-sectional view taken along a line I-I' in FIG. 15A.

FIG. 15D is a cross-sectional view taken along a line I-I' in FIG. 15A.

Referring to FIGS. 15A through 15D, a self-oscillation photonic crystal device 400 may be self-illuminated without receiving a pumping light from the outside. The photonic crystal device 400 includes: a two-dimensional photonic crystal 103 including a gain medium and having a first photonic crystal resonator 101 and a second photonic crystal resonator 102 spaced apart from each other in a second direction; and graphene layers 360 and 380 disposed to cover a portion of the first photonic crystal resonator 101 and not to cover the second photonic crystal resonator 102. The graphene layers 360 and 380 may cover one-third of the first photonic crystal resonator 101. At least one of the first and second photonic crystal resonators 101 and 102 may operate as a light emitting diode by current injection.

The two-dimensional photonic crystal 103 is disposed on a disposition plane defined by a first direction (x-axis) and the second direction (y-axis). The two-dimensional photonic crystal 103 includes a plurality of holes 109 arranged on the disposition plane. The holes 109 may have a triangular lattice structure. Each of the first and second photonic crystal resonators 101 and 102 may have a structure in which three holes arranged adjacent to each other in the first direction are removed and a pair of small holes are arranged in the first direction. The first photonic crystal resonator 101 and the second photonic crystal resonator 102 have the same structure.

The photonic crystal 103 may include: a semiconductor substrate 122; an etch-stop layer 124 grown as a crystal on the semiconductor substrate 122; a lower sacrificial semiconductor layer 126 grown as a crystal on the etch-stop layer 124; a first semiconductor layer 130 of first conductivity type grown on the lower sacrificial semiconductor layer 126; an active semiconductor layer 140 disposed on the first semiconductor layer 130; and a second semiconductor layer 150 of second conductivity type disposed on the active semiconductor layer 140. An insulating support 129 may fill an edge of a cavity 122a formed by removing the lower sacrificial semiconductor layer 126.

An insulating layer 155 may be disposed on the second semiconductor layer 150 of the second conductivity type. The insulating layer 155 may include silicon oxide, aluminum oxide, boron nitride (BN) or hafnium oxide.

The holes 109 may penetrate the first semiconductor layer 130, the active semiconductor layer 140, the second semiconductor layer 150, and the insulating layer 155. The holes 109 may have the same diameter and may be two-dimensionally and periodically arranged to provide a photonic crystal. The holes 109 may have a triangular lattice structure. Lower surfaces of the holes 109 may communicate with a cavity 126a that is formed in the lower sacrificial semiconductor layer 126 and is filled with air. The first photonic crystal resonator 101 may include a first post 127a formed in the lower sacrificial semiconductor layer 126. The second photonic crystal resonator 102 may include a second post 127b formed in the lower sacrificial semiconductor layer 126. Each of the first and second photonic crystal resonators 101 and 102 may be formed such that some of periodically arranged holes are removed or diameters of the holes are made relatively small. The first post 127a and the second post 127b may be regions in which the lower sacrificial semiconductor layer 126 is not removed by wet etching.

The first post 127a and the second post 127b may be used as a current path to apply current.

The first semiconductor layer 130, the active semiconductor layer 140, and the second semiconductor layer 150 may provide a p-i-n diode structure. The active semiconductor layer 140 may be an intrinsic semiconductor region. The active semiconductor layer 140 may emit a light by current injection.

An upper current injection electrode 452 may be disposed in ohmic contact with the second semiconductor layer 150 and may be disposed around the second photonic crystal resonator 102. A lower current injection electrode 121 may be disposed on a lower surface of the semiconductor substrate 122. If current is injected by applying a voltage between the upper current injection electrode 452 and the lower current injection electrode 121, the current may flow through the second post 127b to allow the active semiconductor layer 140 to be self-illuminated.

The semiconductor substrate 110 may be an InP substrate doped with p-type impurities, the etch-stop layer 122 may be an InGaAs layer doped with p-type impurities, and the lower sacrificial semiconductor layer 126 may be an InP layer doped with p-type impurities.

The first semiconductor layer 130 of the first conductivity type may be an InGaAsP layer doped with p-type impurities, and the active semiconductor layer 140 may be a quantum well structure including an undoped InGaAsP layer. The second semiconductor layer 150 of the second conductivity type may be an InGaAsP layer doped with n-type impurities.

The active semiconductor layer 140 may include a 1.24Q InGaAsP layer, 1.30Q InGaAsP layer, a 1.65Q InGaAsP layer, a 1.30Q InGaAsP layer, and a 1.24Q InGaAsP layer which are sequentially stacked. The active semiconductor layer 140 may have a single quantum well structure or a multiple quantum well structure. The 1.24Q InGaAsP layer is an InGaAsP layer with a mole fraction to have a luminescence of 1.24 micrometer. More specifically, the 1.24Q InGaAsP layer may be $In_{0.76}Ga_{0.24}As_{0.85}P_{0.15}$. The 1.65Q InGaAsP layer may be an InGaAsP layer with a mole fraction to have a luminescence of 1.65 micrometer.

The cavity 126a formed in the lower sacrificial semiconductor layer 126 and filled with air may be formed on the etch-stop layer 124 by wet-etching the lower sacrificial semiconductor layer 126. In the first photonic crystal resonator 101, the lower sacrificial semiconductor layer 126 may not be locally etched and may provide a first post 127a. In the second photonic crystal resonator 102, the lower sacrificial semiconductor layer 126 may not be etched and may provide a second post 126b.

The graphene layers 360 and 380 may be disposed on the second semiconductor layer 150 of the second conductivity type to control an optical loss of the first photonic crystal resonator 101. Each of the graphene layers 360 and 380 may be a single graphene layer and may be formed by chemical vapor deposition (CVD) or the like to be transferred onto the insulating layer 155.

A graphene layer includes: a first graphene 360 disposed on the insulating layer 155 or the second semiconductor layer 150 to cover a portion of the first photonic crystal resonator 101; an interlayer dielectric 370 disposed on the first graphene layer 360; and a second graphene layer 380 disposed on the interlayer dielectric 370. A portion of the first graphene layer 360 may be exposed, and a portion of the second graphene layer 380 may be exposed.

Control electrodes 362 and 382 include a first control electrode 362 which is locally disposed on the first graphene layer 360 and is exposed; and a second control electrode 382 which is locally disposed on the second graphene layer 380 and is exposed. A voltage is applied between the first control electrode 362 and the second control electrode 382 to adjust light absorption rates of the first graphene layer 360 and the second graphene layer 380. The first control electrode 362 and the second control electrode 382 may be disposed on the left and right of a first direction where the holes 109 are not arranged, respectively. The first and second control electrodes 362 and 382 may include a Ti/Au thin film.

When a gate voltage is applied between the first control electrode 362 and the second control electrode 382, light absorption characteristics of the first graphene layer 360 and the second graphene layer 380 are electrically controlled by applying a voltage between the first graphene layer 360 and the second graphene layer 380. When a pumping light is provided, the first photonic crystal resonator 101 and the second photonic crystal resonator 102 may oscillate to bonding natural mode/anti-bonding natural mode or single natural mode. In addition, an oscillation wavelength may vary depending on the voltage of the first and second control electrodes 362 and 382.

Figure 16A:
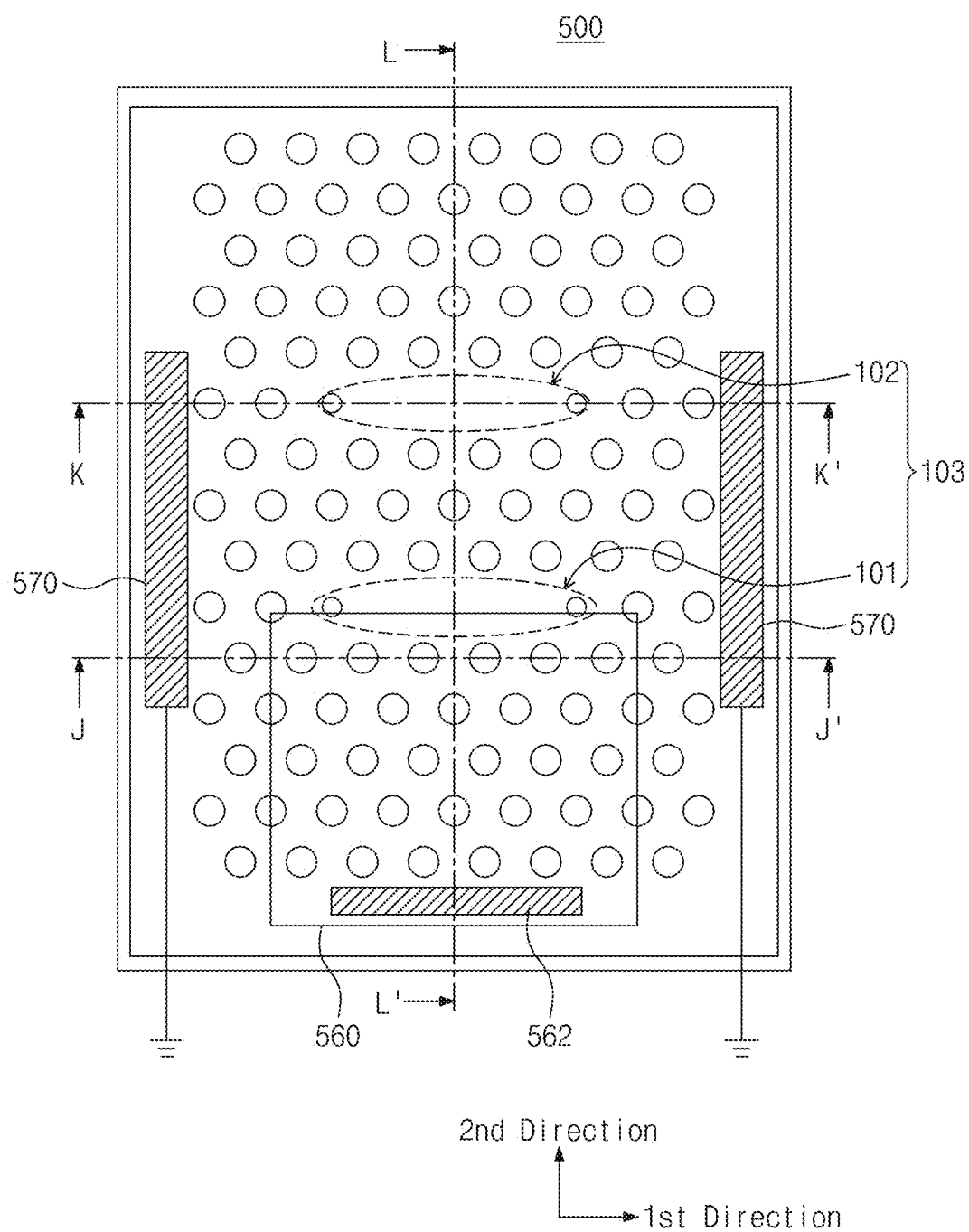
FIG. 16A is a top plan view of a photonic crystal device according to another example embodiment of the present disclosure.

FIG. 16A is a top plan view of a photonic crystal device according to another example embodiment of the present disclosure.

Figure 16B:
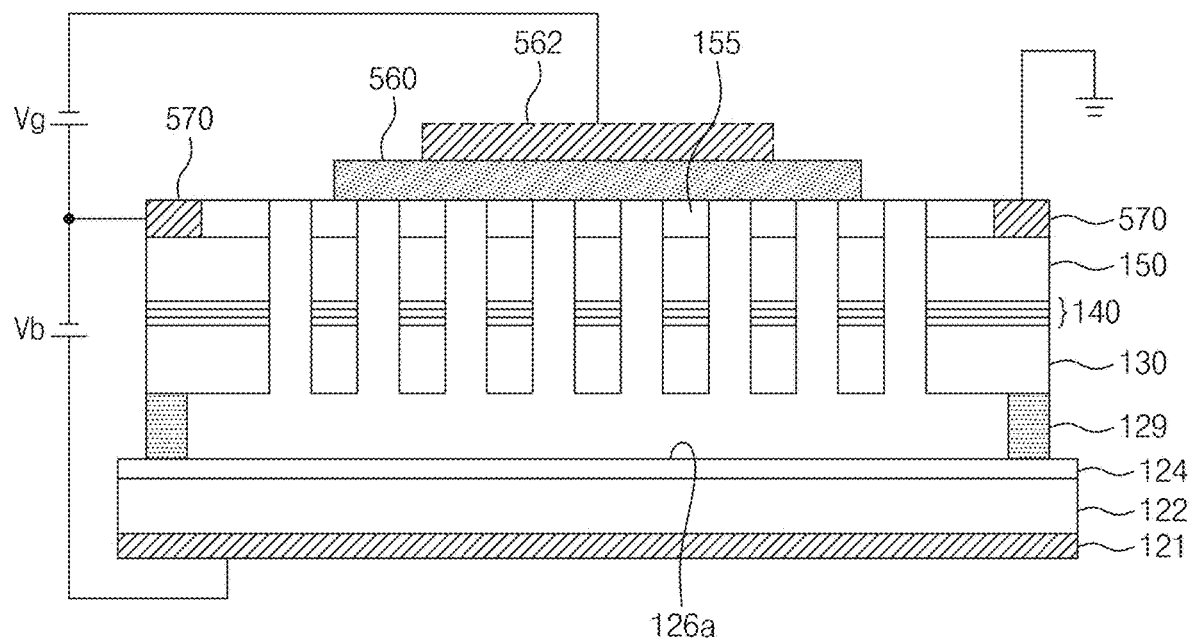
FIG. 16B is a cross-sectional view taken along a line J-J' in FIG. 16A.

FIG. 16B is a cross-sectional view taken along a line J-J' in FIG. 16A.

Figure 16C:
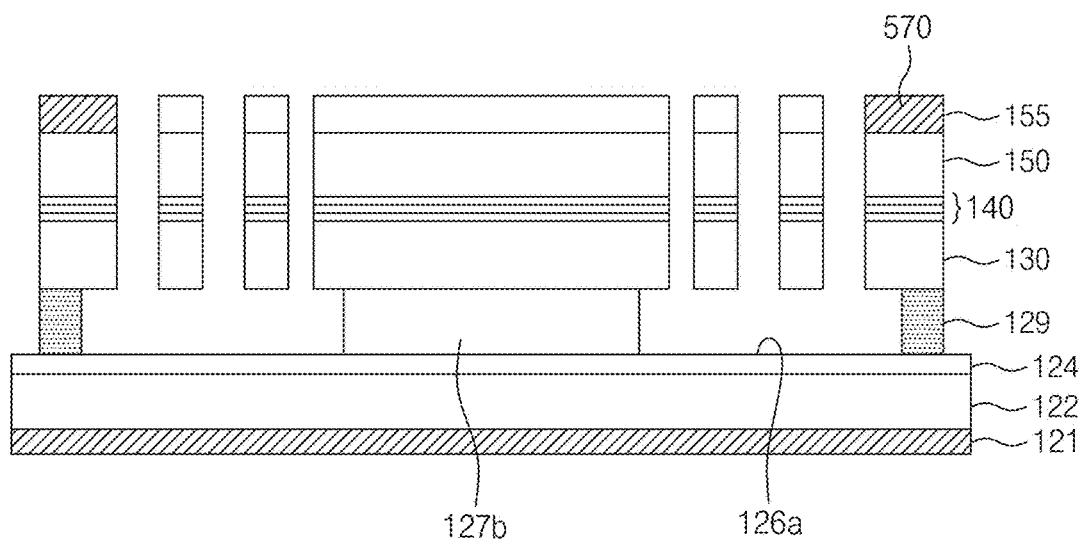
FIG. 16C is a cross-sectional view taken along a line K-K' in FIG. 16A.

FIG. 16C is a cross-sectional view taken along a line K-K' in FIG. 16A.

Figure 16D:
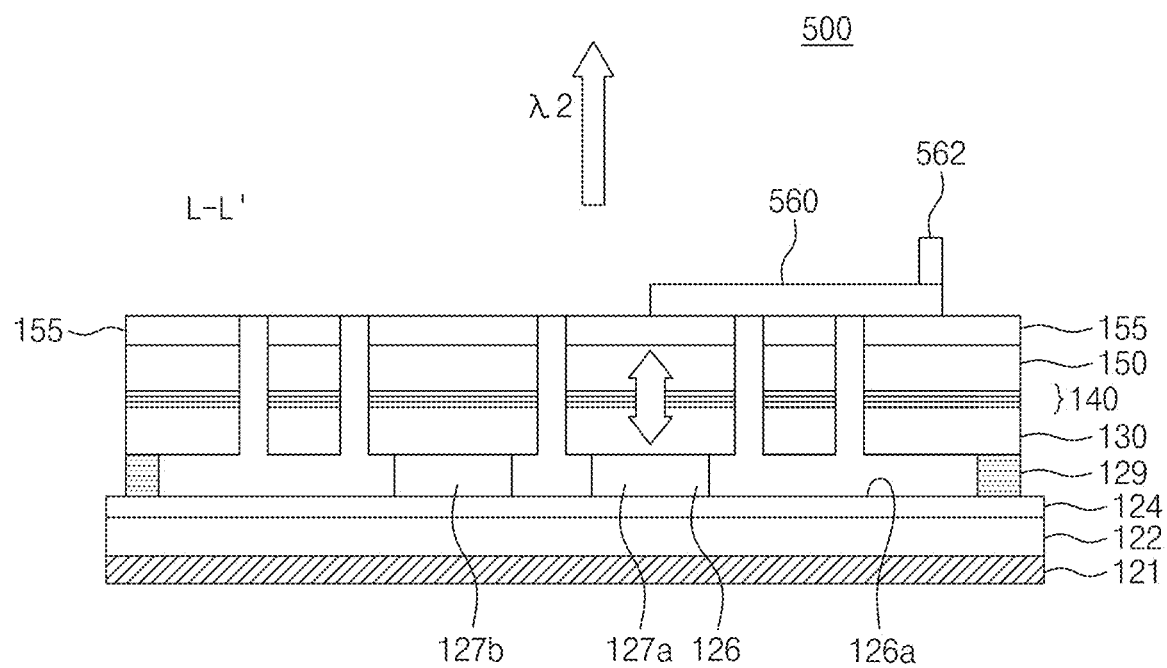
FIG. 16D is a cross-sectional view taken along a line L-L' in FIG. 16A.

FIG. 16D is a cross-sectional view taken along a line L-L' in FIG. 16A.

Referring to FIGS. 16A through 16D, a self-oscillation photonic crystal device 500 may be self-illuminated without receiving a pumping light from the outside. The photonic crystal device 500 includes: a two-dimensional photonic crystal 103 including a gain medium and having a first photonic crystal resonator 101 and a second photonic crystal resonator 102 spaced apart from each other in a second direction; and a graphene layer 560 disposed to cover a portion of the first photonic crystal resonator 101 and not to cover the second photonic crystal resonator 102. The graphene layer 560 may cover one-third of the first photonic crystal resonator 101. At least one of the first and second photonic crystal resonators 101 and 102 may operate as a light emitting diode by current injection.

The two-dimensional photonic crystal 103 is disposed on a disposition plane defined by a first direction (x-axis) and the second direction (y-axis). The two-dimensional photonic crystal 103 includes a plurality of holes 109 arranged on the disposition plane. The holes 109 may have a triangular lattice structure. Each of the first and second photonic crystal resonators 101 and 102 may have a structure in which three holes arranged adjacent to each other in the first direction are removed and a pair of small holes are arranged in the first direction. The first photonic crystal resonator 101 and the second photonic crystal resonator 102 have the same structure.

The photonic crystal 103 may include a semiconductor substrate 122; an etch-stop layer 124 grown as a crystal on the semiconductor substrate 122; a lower sacrificial semiconductor layer 126 grown as a crystal on the etch-stop layer 124; a first semiconductor layer 130 of first conductivity type grown on the lower sacrificial semiconductor layer 126; an active semiconductor layer 140 disposed on the first semiconductor layer 130; and a second semiconductor layer 150 of second conductivity type disposed on the active semiconductor layer 140. An insulating support 129 may fill an edge of a cavity 122a formed by removing the lower sacrificial semiconductor layer 126.

An insulating layer 155 may be disposed on the second semiconductor layer 150 of the second conductivity type. The insulating layer 155 may include silicon oxide, aluminum oxide, boron nitride (BN) or hafnium oxide.

The holes 109 may penetrate the first semiconductor layer 130, the active semiconductor layer 140, the second semiconductor layer 150, and the insulating layer 155. The holes 109 may have the same diameter and may be two-dimensionally and periodically arranged to provide a photonic crystal. The holes 109 may have a triangular lattice structure. Lower surfaces of the holes 109 may communicate with a cavity 126a that is formed in the lower sacrificial semiconductor layer 126 and is filled with air. The first photonic crystal resonator 101 may include a first post 127a formed in the lower sacrificial semiconductor layer 126. The second photonic crystal resonator 102 may include a second post 127b formed in the lower sacrificial semiconductor layer 126. Each of the first and second photonic crystal resonators 101 and 102 may be formed such that some of periodically arranged holes are removed or diameters of the holes are made relatively small. The first post 127a and the second post 127b may be regions in which the lower sacrificial semiconductor layer 126 is not removed by wet etching.

The first post 127a and the second post 127b may be used as a current path to apply current.

The first semiconductor layer 130, the active semiconductor layer 140, and the second semiconductor layer 150 may provide a p-i-n diode structure. The active semiconductor layer 140 may be an intrinsic semiconductor region. The active semiconductor layer 140 may emit a light by current injection.

An upper current injection electrode 570 may be disposed in ohmic contact with the second semiconductor layer 150 and may be disposed around the first photonic crystal resonator 101. A lower current injection electrode 121 may be electrically grounded. The lower current injection electrode 121 may be disposed on a lower surface of the semiconductor substrate 122. If current is injected by applying a voltage between the upper current injection electrode 570 and the lower current injection electrode 121, the current may flow through the first post 127a to allow the active semiconductor layer 140 to be self-illuminated.

The semiconductor substrate 110 may be an InP substrate doped with p-type impurities, the etch-stop layer 122 may be an InGaAs layer doped with p-type impurities, and the lower sacrificial semiconductor layer 126 may be an InP layer doped with p-type impurities.

The first semiconductor layer 130 of the first conductivity type may be an InGaAsP layer doped with p-type impurities, and the active semiconductor layer 140 may be a quantum well structure including an undoped InGaAsP layer. The second semiconductor layer 150 of the second conductivity type may be an InGaAsP layer doped with n-type impurities.

The active semiconductor layer 140 may include a 1.24Q InGaAsP layer, 1.30Q InGaAsP layer, a 1.65Q InGaAsP layer, a 1.30Q InGaAsP layer, and a 1.24Q InGaAsP layer which are sequentially stacked. The active semiconductor layer 140 may have a single quantum well structure or a multiple quantum well structure. The 1.24Q InGaAsP layer is an InGaAsP layer with a mole fraction to have a luminescence of 1.24 micrometer. More specifically, the 1.24Q InGaAsP layer may be $In_{0.76}Ga_{0.24}As_{0.85}P_{0.15}$. The 1.65Q InGaAsP layer may be an InGaAsP layer with a mole fraction to have a luminescence of 1.65 micrometer.

The cavity 126a formed in the lower sacrificial semiconductor layer 126 and filled with air may be formed on the etch-stop layer 124 by wet-etching the lower sacrificial semiconductor layer 126. In the first photonic crystal resonator 101, the lower sacrificial semiconductor layer 126 may not be locally etched and may provide a first post 127a. In the second photonic crystal resonator 102, the lower sacrificial semiconductor layer 126 may not be etched and may provide a second post 126b.

The graphene layer 560 may be disposed on the second semiconductor layer 150 of the second conductivity type to control an optical loss of the first photonic crystal resonator 101. The graphene layers 560 may be a single graphene layer and may be formed by chemical vapor deposition (CVD) or the like to be transferred onto the insulating layer 155.

The graphene layer 560 may be disposed on the insulating layer 155 to over one-third of the first photonic crystal resonator 101.

The control electrode 562 may be locally disposed on the graphene layer 560. A gate voltage is applied between the upper current injection electrode 570 and the control electrode 562 to adjust a light absorption rate of the graphene layer 560. The control electrode 562 may be disposed at a lower side of a second direction where the holes 109 are not arranged.

When a gate voltage is applied between the control electrode 562 and the current injection electrode 570, light absorption characteristics of the graphene layer 560 are electrically controlled by applying a voltage to the graphene layer 560. When a pumping light is provided, the first photonic crystal resonator 101 and the second photonic crystal resonator 102 may oscillate to bonding natural mode/ anti-bonding natural mode or single natural mode. In addition, an oscillation wavelength may vary depending on a voltage of the control electrode 562.

A photonic crystal device according to an example embodiment of the present disclosure converts a laser beam having two different colors to a laser beam having one color by covering only one of two identical photonic crystal nanolasers with a graphene. This conversion point is called an exceptional point. A nanolaser having an exceptional point was experimentally observed.

Controlling an exceptional point of a nanolaser according to an example embodiment of the present disclosure may allow a color of the laser to be changed as desired. Moreover, a new device such as a minimum-sized tunable laser may be provided by introducing an electric driving method.

Although the present disclosure and its advantages have been described in detail, it should be understood that various changes, substitutions and alterations can be made herein without departing from the spirit and scope of the disclosure as defined by the following claims.

What is claimed is:
1. A photonic crystal device comprising:
a two-dimensional crystal including a gain medium and having a first photonic crystal resonator and a second photonic crystal resonator spaced apart from each other; and
a graphene layer disposed to cover a portion of the first photonic crystal resonator and not to cover the second photonic crystal resonator;
further comprising:
a control electrode locally disposed on the graphene layer, wherein:
the control electrode electrically controls light absorption characteristics of the graphene layer by applying a voltage to the graphene layer,
wherein the photonic crystal comprises:
a semiconductor substrate;
an etch-stop layer grown as a crystal on the semiconductor substrate;
a lower sacrificial semiconductor layer grown as a crystal on the etch-stop layer;
a first semiconductor layer of first conductivity type grown on the lower sacrificial semiconductor layer;
an active semiconductor layer disposed on the first semiconductor layer; and
a second semiconductor layer of second conductivity type disposed on the active semiconductor layer,
the photonic crystal includes a plurality of holes penetrating the first semiconductor layer, the active semiconductor layer, and the second semiconductor layer,
the holes have the same diameter and are two-dimensionally and periodically arranged to provide a photonic crystal,
lower surfaces of the holes communicate with a cavity formed in the lower sacrificial semiconductor layer and filled with air,
the first photonic crystal resonator includes a first post formed in the lower sacrificial semiconductor layer,
the second photonic crystal resonator include a second post formed in the lower sacrificial semiconductor layer, and
each of the first and second photonic crystal resonators is formed such that some of the periodically arranged holes are removed or diameters of the holes are made a reduced size compared with the other holes in the photonic crystal,
wherein the active semiconductor layer is the gain medium,
wherein:
the semiconductor substrate is an InP substrate doped with p-type impurities,
the etch-stop layer is an InGaAs layer doped with p-type impurities,
the lower sacrificial semiconductor layer is an InP layer doped with p-type impurities, the first semiconductor layer of the first conductivity type is an InGaAsP layer doped with p-type impurities, the active semiconductor layer is a quantum well structure including an undoped InGaAsP layer, the active semiconductor layer operates as the gain medium, and the second semiconductor layer of the second conductivity type is an InGaAsP layer doped with n-type impurities.

2. The photonic crystal device of claim 1, wherein the first photonic crystal resonator and the second photonic crystal resonator oscillate to bonding natural mode/anti-bonding natural mode or single natural mode according to a voltage of the control electrode.

3. The photonic crystal device of claim 1, wherein the graphene layer covers one-third of the first photonic crystal resonator.

4. The photonic crystal device of claim 1, further comprising:

an insulating support filling an edge of the cavity formed by removing the lower sacrificial semiconductor layer.

5. The photonic crystal device of claim 1, further comprising:

an upper electrode disposed in ohmic contact with the second semiconductor layer and exposed; and a lower electrode disposed below the semiconductor substrate and disposed in ohmic contact with the semiconductor substrate, wherein a light is emitted at the active semiconductor layer by applying current between the upper electrode and the lower electrode.

6. The photonic crystal device of claim 1, further comprising:

an external pumping light source providing a pumping light between the first photonic crystal resonator and the second photonic crystal resonator.

7. The photonic crystal device of claim 1, wherein:

the graphene layer comprises:
 a first graphene layer;
 an interlayer dielectric disposed on the first graphene layer; and
 a second graphene layer disposed on the graphene layer, and the control electrode comprises:
 a first control electrode disposed on the first graphene layer and exposed; and
 a second control electrode disposed on the second graphene layer and exposed, and
 wherein light absorption rates of the first graphene layer and the second graphene layer are adjusted by applying a voltage between the first control electrode and the second control electrode.

8. The photonic crystal device of claim 1, wherein the first photonic crystal resonator and the second photonic crystal resonator are disposed to be vertically symmetrical with respect to three lines of holes.

9. A photonic crystal device comprising:

a two-dimensional crystal including a gain medium and having a first photonic crystal resonator and a second photonic crystal resonator spaced apart from each other; and a graphene layer disposed to cover a portion of the first photonic crystal resonator and not to cover the second photonic crystal resonator, further comprising:

a control electrode locally disposed on the graphene layer, wherein:

the control electrode electrically controls light absorption characteristics of the graphene layer by applying a voltage to the graphene layer, wherein the photonic crystal comprises:
 a semiconductor substrate;
 an etch-stop layer grown as a crystal on the semiconductor substrate;
 a lower sacrificial semiconductor layer grown as a crystal on the etch-stop layer;
 a first semiconductor layer of first conductivity type grown on the lower sacrificial semiconductor layer;
 an active semiconductor layer disposed on the first semiconductor layer; and
 a second semiconductor layer of second conductivity type disposed on the active semiconductor layer, the photonic crystal includes a plurality of holes penetrating the first semiconductor layer, the active semiconductor layer, and the second semiconductor layer, the holes have the same diameter and are two-dimensionally and periodically arranged to provide a photonic crystal, lower surfaces of the holes communicate with a cavity formed in the lower sacrificial semiconductor layer and filled with air, the first photonic crystal resonator includes a first post formed in the lower sacrificial semiconductor layer, and the second photonic crystal resonator include a second post formed in the lower sacrificial semiconductor layer, wherein the active semiconductor layer is the gain medium, wherein:
 the holes have a triangular lattice structure, and
 each of the first and second photonic crystal resonators has a structure in which three holes arranged adjacent to each other are removed and a pair of holes, each of the pair of holes having a smaller diameter than the remaining holes of the plurality of holes, are arranged.

10. A photonic crystal device comprising:

a two-dimensional crystal including a gain medium and having a first photonic crystal resonator and a second photonic crystal resonator spaced apart from each other; and a graphene layer disposed to cover a portion of the first photonic crystal resonator and not to cover the second photonic crystal resonator, further comprising:

a control electrode locally disposed on the graphene layer, wherein:

the control electrode electrically controls light absorption characteristics of the graphene layer by applying a voltage to the graphene layer, wherein the photonic crystal comprises:
 a semiconductor substrate;
 an etch-stop layer grown as a crystal on the semiconductor substrate;
 a lower sacrificial semiconductor layer grown as a crystal on the etch-stop layer;
 a first semiconductor layer of first conductivity type grown on the lower sacrificial semiconductor layer;
 an active semiconductor layer disposed on the first semiconductor layer; and
 a second semiconductor layer of second conductivity type disposed on the active semiconductor layer, the photonic crystal includes a plurality of holes penetrating the first semiconductor layer, the active semiconductor layer, and the second semiconductor layer, the holes have the same diameter and are two-dimensionally and periodically arranged to provide a photonic crystal, lower surfaces of the holes communicate with a cavity formed in the lower sacrificial semiconductor layer and filled with air, the first photonic crystal resonator includes a first post formed in the lower sacrificial semiconductor layer, the second photonic crystal resonator include a second post formed in the lower sacrificial semiconductor layer, and each of the first and second photonic crystal resonators is formed such that some of the periodically arranged holes are removed or diameters of the holes are made a reduced size compared with the other holes in the photonic crystal, wherein the active semiconductor layer is the gain medium, further comprising:
an auxiliary substrate disposed below the semiconductor substrate;
an auxiliary substrate electrode disposed on the auxiliary substrate and exposed; and
an ion-gel disposed to cover the auxiliary substrate electrode and the control electrode.

* * * * *